United States Patent
Nozoe

(10) Patent No.: US 12,009,800 B2
(45) Date of Patent: Jun. 11, 2024

(54) ELASTIC WAVE DEVICE, SPLITTER, AND COMMUNICATION APPARATUS

(71) Applicant: KYOCERA Corporation, Kyoto (JP)

(72) Inventor: Soichiro Nozoe, Kyoto (JP)

(73) Assignee: Kyocera Corporation, Kyoto (JP)

( * ) Notice: Subject to any disclaimer, the term of this patent is extended or adjusted under 35 U.S.C. 154(b) by 610 days.

(21) Appl. No.: 17/293,828

(22) PCT Filed: Nov. 13, 2019

(86) PCT No.: PCT/JP2019/044567
§ 371 (c)(1),
(2) Date: May 13, 2021

(87) PCT Pub. No.: WO2020/100949
PCT Pub. Date: May 22, 2020

(65) Prior Publication Data
US 2022/0014172 A1    Jan. 13, 2022

(30) Foreign Application Priority Data

Nov. 14, 2018  (JP) .................................. 2018-214002

(51) Int. Cl.
*H03H 9/02* (2006.01)
*H03H 9/145* (2006.01)
*H03H 9/25* (2006.01)

(52) U.S. Cl.
CPC ...... *H03H 9/02574* (2013.01); *H03H 9/1457* (2013.01); *H03H 9/25* (2013.01)

(58) Field of Classification Search
CPC ............ H03H 9/02; H03H 9/145; H03H 9/25
See application file for complete search history.

(56) References Cited

U.S. PATENT DOCUMENTS

| | | | |
|---|---|---|---|
| 10,009,009 B2* | 6/2018 | Mimura | H03H 9/1457 |
| 10,574,207 B2* | 2/2020 | Yoon | H03H 9/02858 |
| 10,924,080 B2* | 2/2021 | Kishimoto | H03H 9/0211 |
| 11,057,016 B2* | 7/2021 | Tanaka | H03H 9/25 |
| 2011/0109196 A1 | 5/2011 | Goto et al. | |
| 2014/0145556 A1 | 5/2014 | Kadota | |
| 2019/0109579 A1 | 4/2019 | Tanaka | |
| 2019/0372547 A1 | 12/2019 | Kishimoto et al. | |

FOREIGN PATENT DOCUMENTS

| | | |
|---|---|---|
| WO | 2010/004741 A1 | 1/2010 |
| WO | 2013/021948 A1 | 2/2013 |
| WO | 2017/051874 A1 | 3/2017 |
| WO | 2018/154950 A1 | 8/2018 |

\* cited by examiner

*Primary Examiner* — Andrea Lindgren Baltzell
*Assistant Examiner* — Alan Wong
(74) *Attorney, Agent, or Firm* — Procopio, Cory, Hargreaves & Savitch LLP

(57) ABSTRACT

An elastic wave device includes a substrate, a multilayer film located on the substrate, a piezoelectric layer located on the multilayer film, and an IDT electrode located on the piezoelectric layer. The IDT electrode includes electrode fingers each having a large width from a portion connected to a busbar to a position overlapping tip ends of the other electrode fingers when viewed in an arrangement direction of the electrode fingers.

10 Claims, 15 Drawing Sheets

EXAMPLE 1 — Offset +2 μm

COMPARATIVE EXAMPLE 1

COMPARATIVE EXAMPLE 2 — Offset 0 μm

COMPARATIVE EXAMPLE 3 — Offset −2 μm (a)

(b)

(a)

(b)

(a)

(b)

(a)

(b)

(a)

(b)

EXAMPLE 4    Offset +2 μm

EXAMPLE 5

COMPARATIVE EXAMPLE 8

ELASTIC WAVE DEVICE, SPLITTER, AND COMMUNICATION APPARATUS

TECHNICAL FIELD

The present disclosure relates to an elastic wave device that uses an elastic wave, a splitter including the elastic wave device, and a communication apparatus.

BACKGROUND ART

There is known an elastic wave device that applies a voltage to an interdigital transducer (IDT) electrode on a piezoelectric body to generate an elastic wave that propagates through the piezoelectric body. The IDT electrode includes a pair of comb-teeth electrodes. The pair of comb-teeth electrodes each have a plurality of electrode fingers and are disposed so as to interdigitate with each other. In the elastic wave device, a standing wave of an elastic wave having a wavelength that is twice the pitch of the electrode fingers is formed, and the frequency of this standing wave serves as a resonant frequency.

In recent years, an elastic wave device that uses a Lamb wave among elastic waves has been proposed. As such an elastic wave device, there has been proposed a configuration including a substrate, an acoustic reflection layer located on the substrate, a piezoelectric layer located on the acoustic reflection layer, and an IDT electrode located on the piezoelectric layer. The acoustic reflection layer is formed of low acoustic impedance layers and high acoustic impedance layers that are alternately stacked. This configuration makes it possible to provide an elastic wave device having a resonant point at 5 GHz even when the electrode fingers have a period of about 3 μm.

SUMMARY OF INVENTION

Technical Problem

It is desired to provide an elastic wave device, a splitter, and a communication apparatus that are capable of achieving resonance at a relatively high frequency with respect to the pitch of electrode fingers.

Solution to Problem

An elastic wave device according to an aspect of the present disclosure includes a piezoelectric layer and an IDT electrode located on the piezoelectric layer. The IDT electrode includes a first busbar and a second busbar that are connected to potentials different from each other and that are disposed with a distance therebetween, and first electrode fingers and second electrode fingers that are alternately arranged in an elastic wave propagation direction. The first electrode fingers are connected to the first busbar and extend toward the second busbar. The second electrode fingers are connected to the second busbar and extend toward the first busbar. Each first electrode finger has a wide portion extending from a portion connected to the first busbar to a position overlapping tip ends of the second electrode fingers when viewed in an arrangement direction of the first electrode fingers and the second electrode fingers. The wide portion has a width greater than a width, of the first electrode finger, at a vicinity of a center of an intersection region of the first electrode fingers and the second electrode fingers. The piezoelectric layer has a thickness of less than 1.5p, where p denotes a pitch of the electrode fingers of the IDT electrode.

An elastic wave device according to an aspect of the present disclosure includes a piezoelectric layer and an IDT electrode located on the piezoelectric layer, and uses an A1-mode Lamb wave. The IDT electrode includes a first busbar and a second busbar that are connected to potentials different from each other and that are disposed with a distance therebetween, and first electrode fingers and second electrode fingers that are alternately arranged in an elastic wave propagation direction. The first electrode fingers are connected to the first busbar and extend toward the second busbar. The second electrode fingers are connected to the second busbar and extend toward the first busbar. Each first electrode finger has a wide portion extending from a portion connected to the first busbar to a position overlapping tip ends of the second electrode fingers when viewed in an arrangement direction of the first electrode fingers and the second electrode fingers. The wide portion has a width greater than a width, of the first electrode finger, at a vicinity of a center of an intersection region of the first electrode fingers and the second electrode fingers.

A splitter according to an aspect of the present disclosure includes an antenna terminal, a transmission filter configured to filter a signal that is to be output to the antenna terminal, and a reception filter configured to filter a signal received from the antenna terminal. At least one of the transmission filter or the reception filter includes the above elastic wave device.

A communication apparatus according to an aspect of the present disclosure includes an antenna, the above splitter comprising the antenna terminal connected to the antenna, and an IC connected to the transmission filter and the reception filter, the IC being connected on an opposite side from the antenna terminal in a signal path.

Advantageous Effects of Invention

According to the above-described configuration, it is possible to achieve resonance at a relatively high frequency with respect to the pitch of electrode fingers.

DESCRIPTION OF EMBODIMENTS

Figure 1:
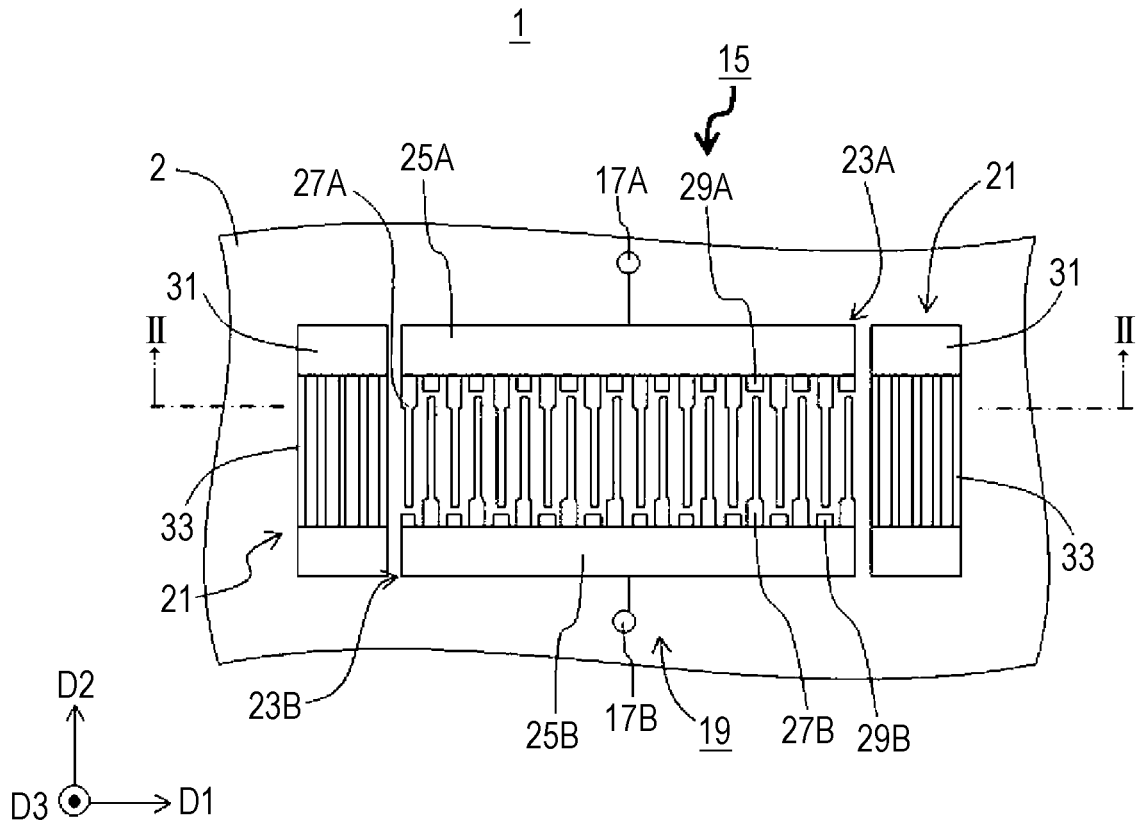
FIG. 1 is a plan view of an elastic wave device according to an embodiment.

Hereinafter, an embodiment according to the present disclosure will be described with reference to the drawings. The drawings used in the following description are schematic, and dimensional ratios and the like in the drawings do not necessarily coincide with actual dimensional ratios.

In an elastic wave device according to the present disclosure, either direction may be an upward direction or a downward direction. Hereinafter, for the sake of convenience, an orthogonal coordinate system composed of a D1 axis, a D2 axis, and a D3 axis is defined, and a term such as an upper surface or a lower surface may be used under the assumption that the positive side of the D3 axis corresponds to an upward direction. In addition, a plan view or a perspective plan view refers to a view in a D3-axis direction unless otherwise specified. The D1 axis is defined to be parallel to a propagation direction of an elastic wave that propagates along an upper surface of a piezoelectric layer described below. The D2 axis is defined to be parallel to the upper surface of the piezoelectric layer and to be orthogonal to the D1 axis. The D3 axis is defined to be orthogonal to the upper surface of the piezoelectric layer.

(Overall Configuration of Elastic Wave Device)

Figure 2:
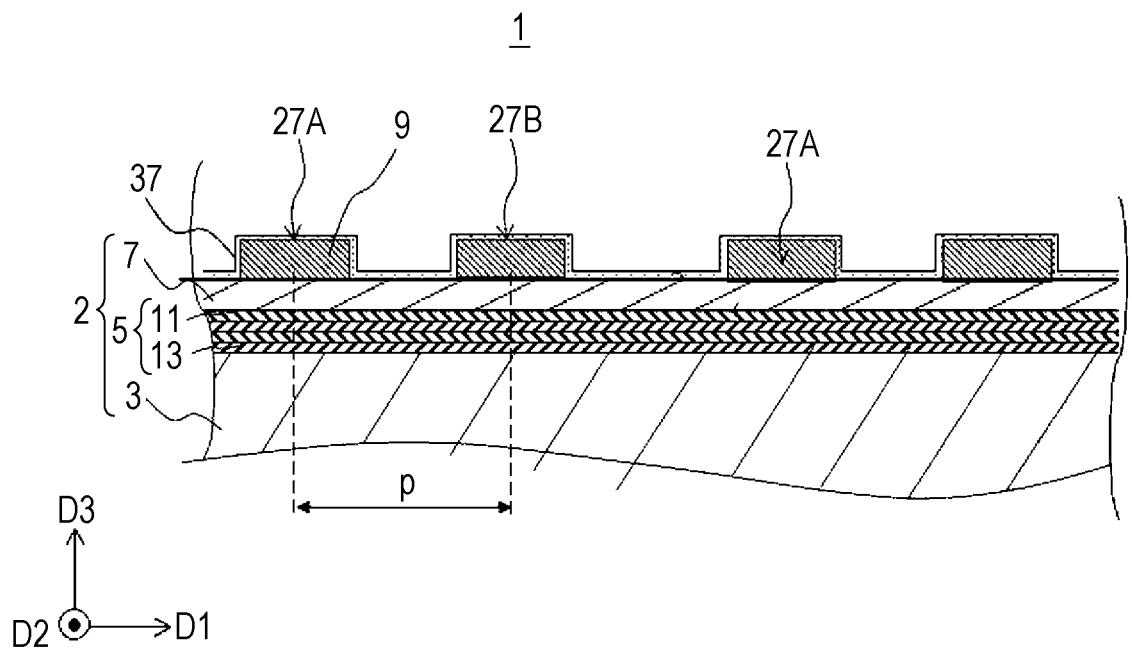
FIG. 2 is a sectional view taken along line II-II of the elastic wave device in FIG. 1.

FIG. 1 is a plan view illustrating a configuration of a main part of an elastic wave device 1. FIG. 1 illustrates a configuration of a resonator described below. FIG. 2 is a sectional view taken along line II-II in FIG. 1.

The elastic wave device 1 includes, for example, a substrate 3 (FIG. 2), a multilayer film 5 (FIG. 2) located on the substrate 3, a piezoelectric layer 7 located on the multilayer film 5, and a conductive layer 9 located on the piezoelectric layer 7. Each layer has, for example, a substantially uniform thickness. A combination of the substrate 3, the multilayer film 5, and the piezoelectric layer 7 may be referred to as an affixed substrate 2 (FIG. 2).

In the elastic wave device 1, a voltage applied to the conductive layer 9 excites an elastic wave that propagates through the piezoelectric layer 7. The elastic wave device 1 constitutes, for example, a resonator and/or a filter that uses this elastic wave. For example, the multilayer film 5 contributes to reflecting the elastic wave and confining energy of the elastic wave in the piezoelectric layer 7. For example, the substrate 3 contributes to increasing the strength of the multilayer film 5 and the piezoelectric layer 7.

The elastic wave device 1 may be a single resonator illustrated in FIG. 1 or may include a plurality of resonators to form a filter or the like.

(Schematic Configuration of Affixed Substrate)

The substrate 3 does not have a direct influence on the electrical characteristics of the elastic wave device 1. Thus, the material and dimensions of the substrate 3 may be appropriately set. The material of the substrate 3 is, for example, an insulating material. The insulating material is, for example, a resin or a ceramic. The substrate 3 may be made of a material having a lower thermal expansion coefficient than the piezoelectric layer 7 or the like. In this case, for example, a possibility that the frequency characteristics of the elastic wave device 1 are changed by a temperature change can be reduced. Examples of such a material include a semiconductor such as silicon, a single crystal such as sapphire, and a ceramic such as sintered aluminum oxide. The substrate 3 may be formed of a plurality of stacked layers made of materials different from each other. The substrate 3 is thicker than the piezoelectric layer 7, for example.

The multilayer film 5 is formed of low acoustic impedance layers 11 and high acoustic impedance layers 13 that are alternately stacked. Thus, the reflectivity for an elastic wave is relatively high at the interfaces between these layers. As a result, for example, leakage of the elastic wave that propagates through the piezoelectric layer 7 is reduced in a thickness direction. An example of the material of the low acoustic impedance layers 11 includes silicon dioxide ($SiO_2$). Examples of the material of the high acoustic impedance layers 13 include tantalum pentoxide ($Ta_2O_5$), hafnium oxide ($HfO_2$), zirconium oxide ($ZrO_2$), and titanium oxide ($TiO_2$).

The number of stacked layers in the multilayer film 5 may be appropriately set. For example, the total number of low acoustic impedance layers 11 and high acoustic impedance layers 13 stacked in the multilayer film 5 may be two or more and twelve or less. The total number of stacked layers in the multilayer film 5 may be an even number or an odd number, but the layer that is in contact with the piezoelectric layer 7 is the low acoustic impedance layer 11. The layer that is in contact with the substrate 3 may be either the low acoustic impedance layer 11 or the high acoustic impedance layer 13. A supplementary film may be inserted between the individual layers, between the substrate 3 and the multilayer film 5, or between the multilayer film 5 and the piezoelectric layer 7 for the purpose of close contact or diffusion inhibition. In this case, the supplementary film may be thin (about 0.01λ or less) such that the characteristics of the elastic wave device 1 are not affected.

The piezoelectric layer 7 is made of a single crystal of lithium tantalate (LiTaO$_3$, hereinafter referred to as LT) or lithium niobate (LiNbO$_3$, hereinafter referred to as LN).

In a case where LT is used as the piezoelectric layer 7, the cut angles are, for example, (0°±10°, 0° or more and 55° or less, 0°±10°) in Euler angles ($\varphi$, $\theta$, $\psi$). In another viewpoint, LT is of rotated Y-cut X-propagation, and the Y axis is inclined at an angle of 90° or more and 145° with respect to the normal (the D3 axis) of the piezoelectric layer 7. The X axis is substantially parallel to the upper surface of the piezoelectric layer 7 (the D1 axis). Note that the X axis and the D1 axis may be inclined at −10° or more and 10° or less in an X-Z plane or a D1-D2 plane.

In a case where LN is used as the piezoelectric layer 7, the cut angles are (0°±10°, 0°±15°, $\psi$) in Euler angles, where $\psi$ ranges from 0° to 360°. Alternatively, the cut angles may be (0°±5°, 0°±5°, $\psi$). In another viewpoint, a Z-cut substrate may be used.

The piezoelectric layer 7 has a relatively small thickness, for example, a thickness of 0.75$\lambda$ or less, where $\lambda$ described below is a reference. More specifically, the thickness is 0.15$\lambda$ or more and 0.3$\lambda$ or less. As a result of setting the cut angles and the thickness of the piezoelectric layer 7 in the above-described manner, it is possible to use, as an elastic wave, a wave of an oscillation mode close to an A1-mode Lamb wave.

In the present embodiment, a case where LN is used as the piezoelectric layer 7 will be described below as an example.

(Schematic Configuration of Conductive Layer)

The conductive layer 9 is made of, for example, a metal. The metal may be of an appropriate type, and is, for example, aluminum (Al) or an alloy containing Al as a main component (Al alloy). The Al alloy is, for example, an Al-copper (Cu) alloy. The conductive layer 9 may be formed of a plurality of metal layers. A relatively thin layer made of titanium (Ti) may be provided between the Al or Al alloy and the piezoelectric layer 7 to enhance the bonding therebetween.

In the example illustrated in FIG. 1, the conductive layer 9 is formed to constitute a resonator 15. The resonator 15 is configured as a so-called one-port elastic wave resonator. In response to input of an electric signal having a predetermined frequency from one of terminals 17A and 17B, which are conceptually and schematically illustrated, the resonator 15 is capable of generating resonance and outputting a signal caused by the resonance from the other of the terminals 17A and 17B.

The conductive layer 9 (the resonator 15) includes, for example, an IDT electrode 19 and a pair of reflectors 21 located on both sides of the IDT electrode 19.

The IDT electrode 19 includes a pair of comb-teeth electrodes 23 (a first comb-teeth electrode 23A and a second comb-teeth electrode 23B) connected to potentials different from each other. Each comb-teeth electrode 23 includes, for example, a busbar 25 (a first busbar 25A or a second busbar 25B), a plurality of electrode fingers 27 (first electrode fingers 27 or second electrode fingers 27B) extending from the busbar 25 in parallel to each other, and dummy electrodes 29 (first dummy electrodes 29A or second dummy electrodes 29B) protruding from the busbar 25 between the plurality of electrode fingers 27. The pair of comb-teeth electrodes 23 are disposed such that the plurality of electrode fingers 27 interdigitate (intersect) with each other.

Hereinafter, the first comb-teeth electrode 23A and the second comb-teeth electrode 23B each will be simply referred to as a comb-teeth electrode 23 in the description common to both of them. The same applies to the other elements.

The busbar 25 has, for example, an elongated shape linearly extending in an elastic wave propagation direction (a D1-axis direction) with a substantially uniform width. The pair of busbars 25 face each other in a direction orthogonal to the elastic wave propagation direction (a D2-axis direction). The busbar 25 may have an ununiform width or may be inclined with respect to the elastic wave propagation direction.

Each electrode finger 27 has, for example, an elongated shape linearly extending in the direction orthogonal to the elastic wave propagation direction (the D2-axis direction) with a substantially uniform width. In each comb-teeth electrode 23, the plurality of electrode fingers 27 are arranged in the elastic wave propagation direction. The plurality of electrode fingers 27 of one of the comb-teeth electrodes 23 and the plurality of electrode fingers 27 of the other comb-teeth electrode 23 are alternately arranged in principle.

A pitch p of the plurality of electrode fingers 27 (for example, the distance between centers of two electrode fingers 27 adjacent to each other) is basically constant in the IDT electrode 19. A part of the IDT electrode 19 may have a narrow pitch portion in which the pitch p is smaller than that in most of the other portions or a wide pitch portion in which the pitch p is larger than that in most of the other portions.

In the following description, the pitch p refers to a pitch in a portion (the majority of the plurality of electrode fingers 27) other than an exceptional portion such as the foregoing narrow pitch portion or wide pitch portion unless otherwise specified. In a case where the pitch varies also in the majority of the plurality of electrode fingers 27 other than the exceptional portion, an average value of the pitches of the majority of the plurality of electrode fingers 27 may be used as the value of the pitch p. The "majority" refers to, for example, 80% or more of all the electrode fingers 27.

The lengths of the plurality of electrode fingers 27 are equivalent to each other, for example. The IDT electrode 19 may be subjected to so-called apodization in which the lengths (the intersecting widths in another viewpoint) of the plurality of electrode fingers 27 vary according to the position in the propagation direction.

The dummy electrodes 29 protrude, for example, in the direction orthogonal to the elastic wave propagation direction with a substantially uniform width. Tip ends of the dummy electrodes 29 of one of the comb-teeth electrodes 23 face tip ends of the electrode fingers 27 of the other comb-teeth electrode 23 with gaps therebetween. The IDT electrode 19 does not necessarily include the dummy electrodes 29.

The pair of reflectors 21 are located on both sides of the plurality of IDT electrodes 19 in the elastic wave propagation direction. Each reflector 21 is formed, for example, in a grating shape. Specifically, the reflector 21 includes a pair of busbars 31 facing each other, and a plurality of strip electrodes 33 extending between the pair of busbars 31. The pitch of the plurality of strip electrodes 33 and the pitch of the electrode finger 27 and the strip electrode 33 adjacent to each other are basically equivalent to the pitch of the plurality of electrode fingers 27.

The upper surface of the piezoelectric layer 7 may be covered with a protective film 37 from above the conductive layer 9. The protective film 37 is made of a material having a lower acoustic velocity than the piezoelectric layer 7.

Examples of such a material include $SiO_2$, $Si_3N_4$, and Si. The protective film 37 may be provided only immediately above the conductive layer 9 or may be provided also between the electrode fingers 27 formed of the conductive layer 9. In a case where the protective film 37 is provided also between the electrode fingers 27, the protective film 37 may be made of an insulating material. The protective film 37 may be a multilayer body of a plurality of layers made of these materials.

The protective film 37 may be a film for simply suppressing corrosion of the conductive layer 9 or may be a film that contributes to temperature compensation. To clarify the acoustic boundary between the conductive layer 9 and the protective film 37 and to improve the reflection coefficient of an elastic wave, a supplementary film made of an insulator or a metal may be provided on the upper surfaces or lower surfaces of the IDT electrode 19 and the reflectors 21.

The configuration illustrated in FIG. 1 and FIG. 2 may be appropriately packaged. The package may be, for example, a package in which the illustrated configuration is mounted on a mount substrate that is not illustrated such that the upper surface of the piezoelectric layer 7 faces the mount substrate with a gap interposed therebetween, and resin sealing is applied thereto, or may be a wafer level package in which a box-shaped cover is provided over the piezoelectric layer 7.

(Use of A1-Mode Lamb Wave)

When a voltage is applied to the pair of comb-teeth electrodes 23, the voltage is applied to the piezoelectric layer 7 by the plurality of electrode fingers 27, and the piezoelectric layer 7 serving as a piezoelectric body oscillates. Accordingly, an elastic wave that propagates in the D1-axis direction is excited. The elastic wave is reflected by the plurality of electrode fingers 27. Subsequently, a standing wave having a half wavelength ($\lambda/2$) substantially equal to the pitch p of the plurality of electrode fingers 27 occurs. An electric signal generated in the piezoelectric layer 7 by the standing wave is extracted by the plurality of electrode fingers 27. On the basis of this principle, the elastic wave device 1 functions as a resonator having, as a resonant frequency, the frequency of an elastic wave having a half wavelength equal to the pitch p. Note that k is a symbol usually representing a wavelength. The actual wavelength of an elastic wave may deviate from 2p. However, when the symbol k is used below, $\lambda$ means 2p unless otherwise specified.

As described above, the piezoelectric layer 7 is relatively thin and has Euler angles (0°±10°, 0°±15°, 0°±10°). Thus, the elastic wave device 1 is able to use an elastic wave of an A1-mode Lamb wave. The propagation velocity (acoustic velocity) of an A1-mode elastic wave is higher than the propagation velocity of a typical surface acoustic wave (SAW). For example, the propagation velocity of a typical SAW is 3000 to 4000 m/s, whereas the propagation velocity of an A1-mode elastic wave is 10000 m/s or more. Thus, it is possible to achieve resonance in a higher frequency region than in the related art with the pitch p equivalent to the pitch in the related art. For example, a resonant frequency of 5 GHz or more can be achieved with the pitch p of 1 μm or more.

(Settings of Material and Thickness of Each Layer)

To achieve resonance in a relatively high frequency region (for example, 5 GHz or more) by using an A1-mode elastic wave, there are conditions on the combination of the material and the thickness of the multilayer film 5; the Euler angles, the material, and the thickness of the piezoelectric layer (the piezoelectric layer 7 in the present embodiment); and the thickness of the conductive layer 9.

For example, under the following conditions, it was possible to achieve resonance at 5 GHz in a state in which there is no spurious near the resonant frequency and the anti-resonant frequency.

Piezoelectric Layer:
Material: LN
Thickness: 0.19$\lambda$
Euler angles: (0, 0, 0)
Multilayer Film:
Material: two types ($SiO_2$, $Ta_2O_5$)
Thickness: $SiO_2$ layer 0.10$\lambda$, $Ta_2O_5$ layer 0.07$\lambda$
Number of stacked layers: 8
Conductive Layer:
Material: Al
Thickness: 0.06$\lambda$
Pitch p: 1 μm ($\lambda$=2 μm)

The number of stacked layers in the multilayer film 5 is the total number of two types of layers (for example, four in the example in FIG. 2). The pitch p is 1 μm. In a case where the pitch is changed, if the actual film thickness is changed in accordance with the wavelength expressed by $\lambda$=2p, a similar result is obtained for the resonance characteristic although frequency dependence is shifted as a whole. That is, a similar result can be obtained also in a case where normalization is performed with the wavelength or pitch.

In addition to the above example, for example, in a case where the pitch was 0.9 μm to 1.4 μm under the following conditions, it was possible to achieve resonance at 5 GHz or more and to achieve a state in which there is no ripple near the resonant frequency and the anti-resonant frequency. The following conditions are shown in the order of the material of the piezoelectric layer 7, the thickness of the piezoelectric layer 7, the material of the low acoustic impedance layer 11, the thickness of the low acoustic impedance layer 11, the material of the high acoustic impedance layer 13, and the thickness of the high acoustic impedance layer 13, which are divided by "/".

Other Conditions 1: LN/0.2$\lambda$/$SiO_2$/0.06$\lambda$/$HfO_2$/0.095$\lambda$
Other Conditions 2: LT/0.175$\lambda$/$SiO_2$/0.09$\lambda$/$Ta_2O_5$/0.07$\lambda$
Other Conditions 3: LT/0.2$\lambda$/$SiO_2$/0.1$\lambda$/$HfO_2$/0.08$\lambda$ Under the other conditions 2 or 3, the Euler angles of LT are (0°±5°, 24°±5°, 0°±5°) or (0°±5°, 16°±5°, 0°±5°).

(Structure of Electrode Fingers)

When an A1-mode Lamb wave was used in the elastic wave device 1, the impedance characteristic between the resonant frequency (fr) and the anti-resonant frequency (fa) tended to be undesirable compared to that of a normal elastic wave device in which the piezoelectric layer 7 has a thickness of about 20 μm. This tendency becomes remarkable as the thickness of the piezoelectric layer 7 decreases.

Figure 3:
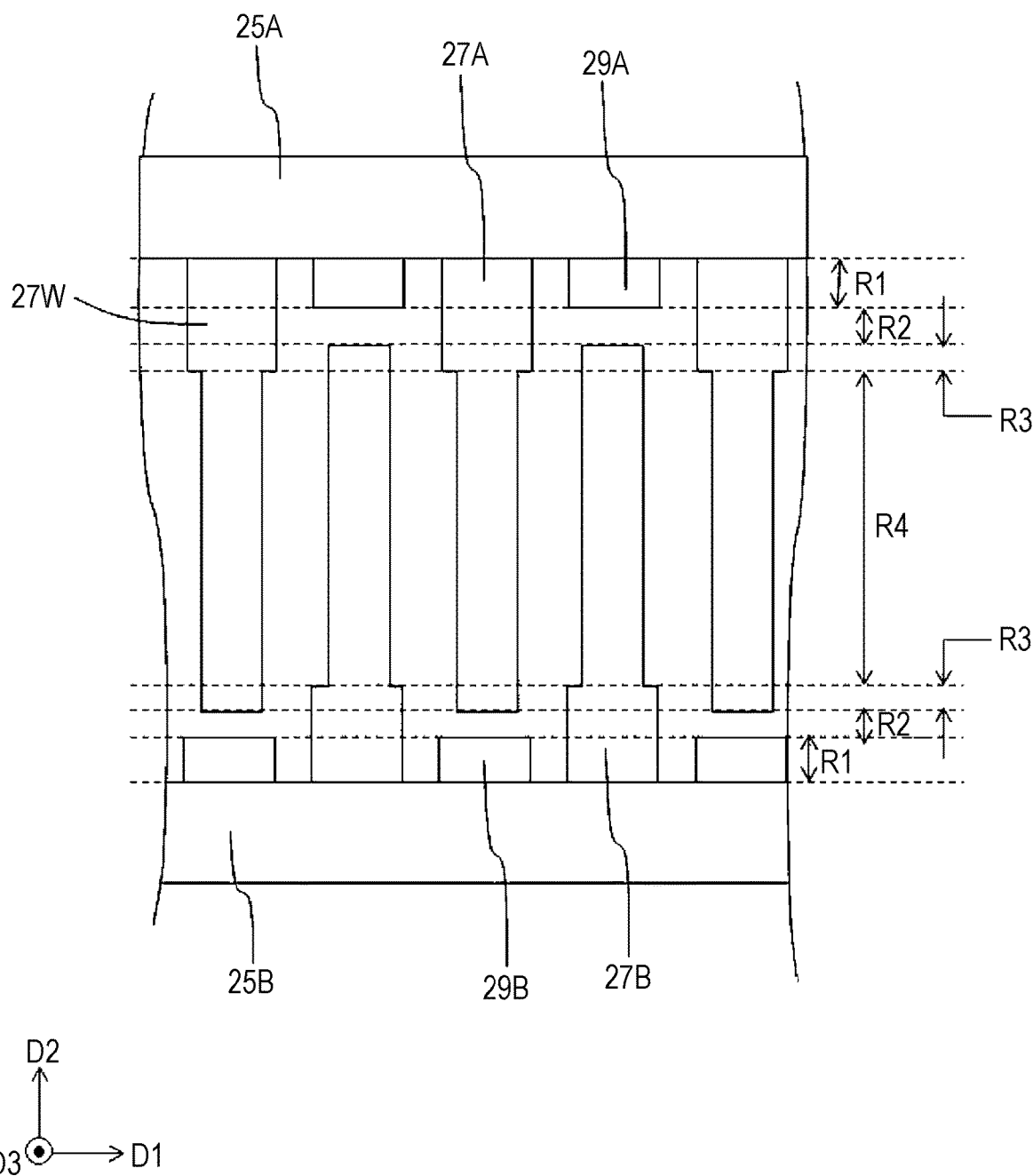
FIG. 3 is an enlarged view of a main part of FIG. 1.

In contrast, the elastic wave device 1 includes the electrode fingers 27 whose widths vary. FIG. 3 is an enlarged view of a main part of FIG. 1. As illustrated in FIG. 3, there are a region R1 overlapping the dummy electrodes 29, a region R2 overlapping gaps between the dummy electrodes 29 and tip ends of the electrode fingers 27, a region R3 overlapping the tip ends of the electrode fingers 27, and a region R4 including a center portion of an intersection region of the electrode fingers 27, which extend in the propagation direction of a SAW (that is, a repetitive arrangement direction of the electrode fingers 27, the D1 direction). In this example, the intersection region of the electrode fingers 27 is parallel to the propagation direction, and thus division into the regions R1 to R4 is performed in the propagation direction. However, in a case where the IDT electrode 19 is apodized or inclined, the regions R1 to R4 may be inclined accordingly. For example, in a case where the intersecting width of the electrode fingers 27 is substantially uniform and an imaginary line connecting the tip ends of the electrode fingers 27 is inclined with respect to the repetitive arrangement direction of the electrode fingers 27, the regions R1 to R4 have a parallelogram shape corresponding to the inclination of the imaginary line. Such an inclination angle depends on the Euler angles, the thickness, and so forth of the piezoelectric layer 7, but may be, for example, 5° or more and 45° or less. In the case of the above conditions, the inclination angle may be, for example, 25° or more and 35° or less. In such a case where the imaginary line of the IDT electrode 19 is inclined, leakage in a transverse mode can be reduced.

First, the line widths (the widths in the D1 direction) of the dummy electrodes 29 and the electrode fingers 27 in the region R1 (that is, the bases of the electrode fingers 27, the portions connected to the busbar 31, hereinafter simply referred to as connection portions or connection portion sides) are greater than the line widths of the electrode fingers 27 in the region R4. In other words, the electrode fingers 27 each have a wide portion 27W. This configuration reduces loss in the transverse mode.

Furthermore, in this example, the line widths of the electrode fingers 27 are greater at the connection portions and the vicinity thereof, that is, in the regions R1, R2, and R3, than in the region R4. That is, when viewed in the arrangement direction of the electrode fingers 27, the wide portions 27W extend to positions overlapping the tip ends of the other electrode fingers 27. The line widths of the electrode fingers 27 are not great at the tip end portions located in the region R3.

In this way, by widening the electrode fingers 27 at the connection portion sides to the region R3 (by forming the wide portions 27W), the maximum phase (MaxPh) between fr and fa can be increased, and an elastic wave element with decreased loss can be provided. Because the phase can be reduced also on the higher frequency side than fa, an elastic wave device with decreased loss can be provided.

For example, the duty in the regions R1 to R3 is 1.05 times or more and 1.3 times or less the duty in the region R4. Specifically, the duty in the regions R1 to R3 may be 0.5 to 0.8.

The length of the region R3 in the D2 direction may be, for example, 0.5p or more and 2.5p or less. The length of the region R4 in the D2 direction may be 65% or more of the intersecting width of the electrode fingers 27.

Figure 4:
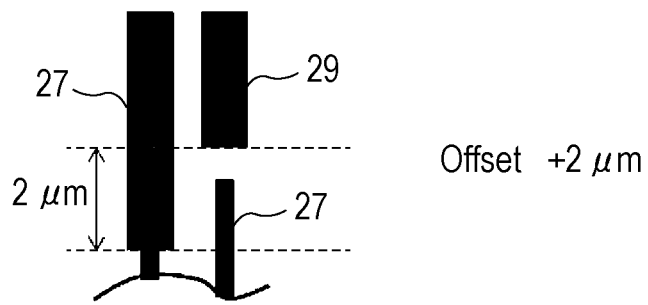
FIG. 4 is a diagram illustrating electrode finger models of Example and Comparative Examples.
Figure 4:
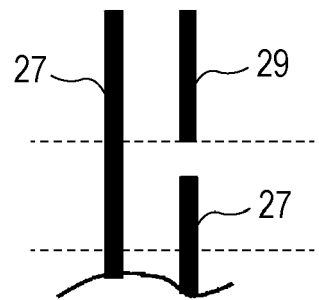
Figure 4:
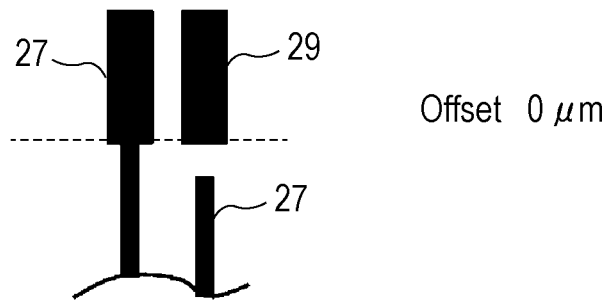
Figure 4:
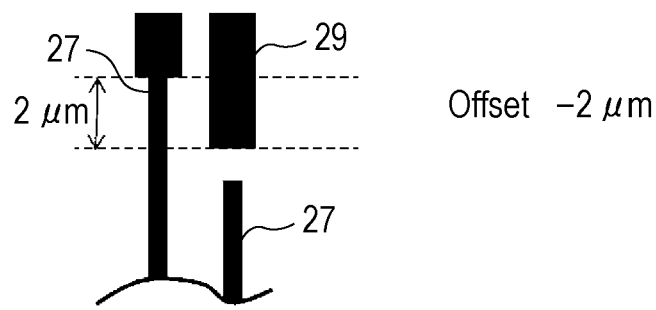

The above-described effects were verified with measured values. The propagation angle ($\psi$) of the piezoelectric layer 7 is 90°. The IDT electrode 19 was formed on the upper surface of the piezoelectric layer 7. Models of electrode finger shapes of the IDT electrodes 19 according to Example 1 and Comparative Examples 1 to 3 are as illustrated in FIG. 4. In the elastic wave element 1 according to Example 1, the base of the electrode finger 27 is wide in the regions R1 to R3. Specifically, the wide portion extends to 2 µm ahead of the position corresponding to the tip end of the dummy electrode 29. In Comparative Example 1, the electrode finger 27 and the dummy electrode 29 have, in their entire regions, the same width as the width of the electrode finger 27 in the region R4 of Example 1. In Comparative Example 2, the base of the electrode finger 27 is wide to the position corresponding to the tip end of the dummy electrode 29. In other words, the base is wide in the entire region R1. In Comparative Example 3, the base of the electrode finger 27 is wide to the position 2 µm behind the position corresponding to the tip end of the dummy electrode 29. In the following description, the length over which the base of the electrode finger 27 is wide may be represented by an offset amount with respect to the tip end of the dummy electrode 29. That is, the offset amount is +2 µm in Example 1, 0 µm in Comparative Example 2, and −2 µm in Comparative Example 3.

Figure 5:
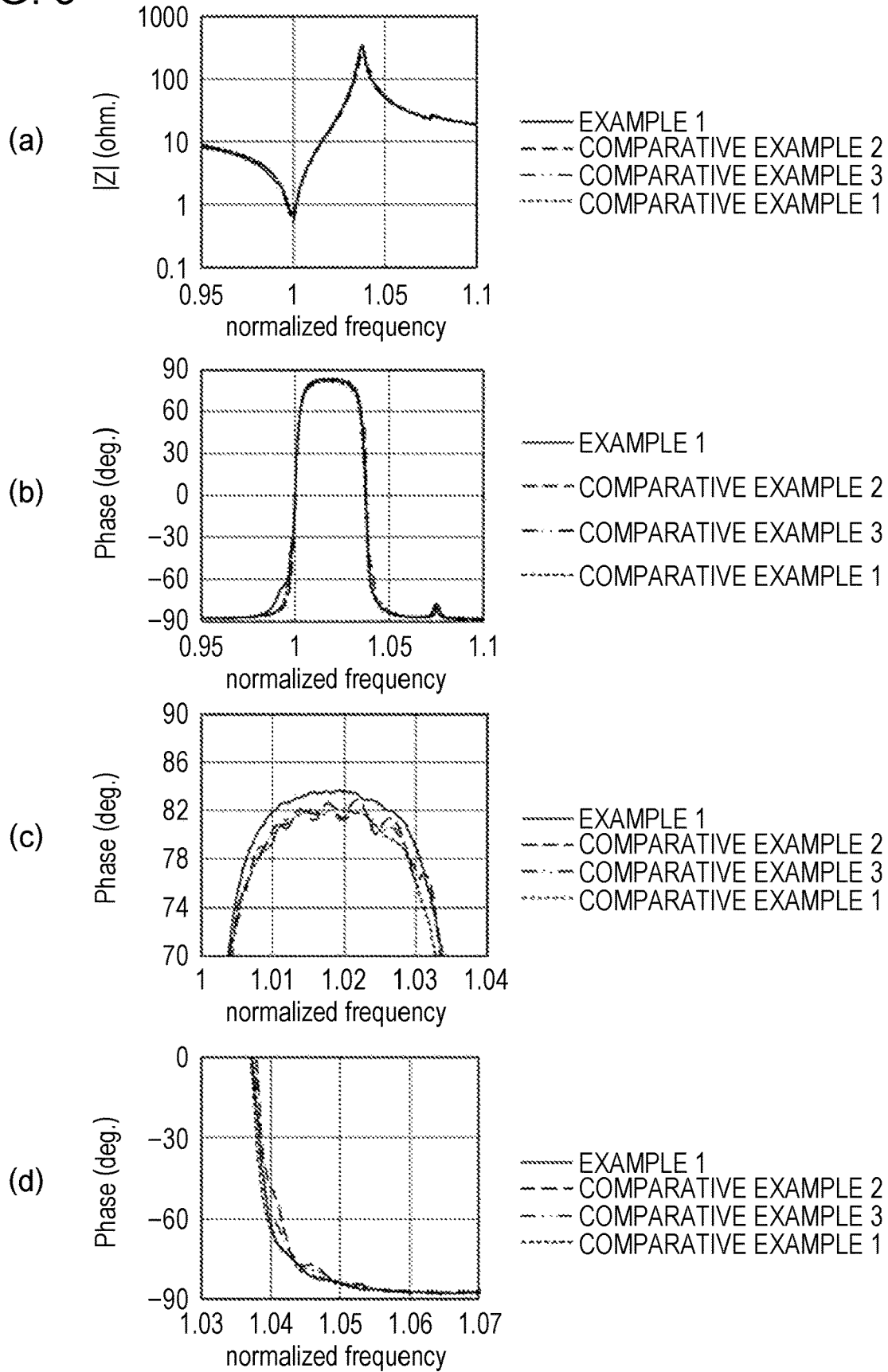
FIG. 5(a) is a graph illustrating impedance characteristics of Example and Comparative Examples.
FIG. 5(b) is a graph illustrating phase characteristics of Example and Comparative Examples.
FIG. 5(c) and FIG. 5(d) are enlarged views of a main part of FIG. 5(b).

FIG. 5 illustrates measurement results of the frequency characteristics in Example 1 and Comparative Examples 1 to 3. FIG. 5(a) illustrates impedance characteristics, FIG. 5(b) illustrates phase characteristics, FIG. 5(c) illustrates an enlarged view of fr-fa and the vicinity thereof in FIG. 5(b), and FIG. 5(d) illustrates an enlarged view of the high frequency side of fa in FIG. 5(b). In FIG. 5, the horizontal axis represents normalized frequency, and the vertical axis represents impedance in FIG. 5(a) and phase in FIG. 5(b) to FIG. 5(d).

As is apparent from FIG. 5, in fr-fa and the vicinity thereof, Example 1 has an improved phase characteristic as compared with Comparative Examples 1 to 3. Specifically, the overall phase level is improved, and phase spurious between fr and fa is reduced. Furthermore, it was confirmed that the phase could be reduced also on the high frequency side of fa.

Figure 6:
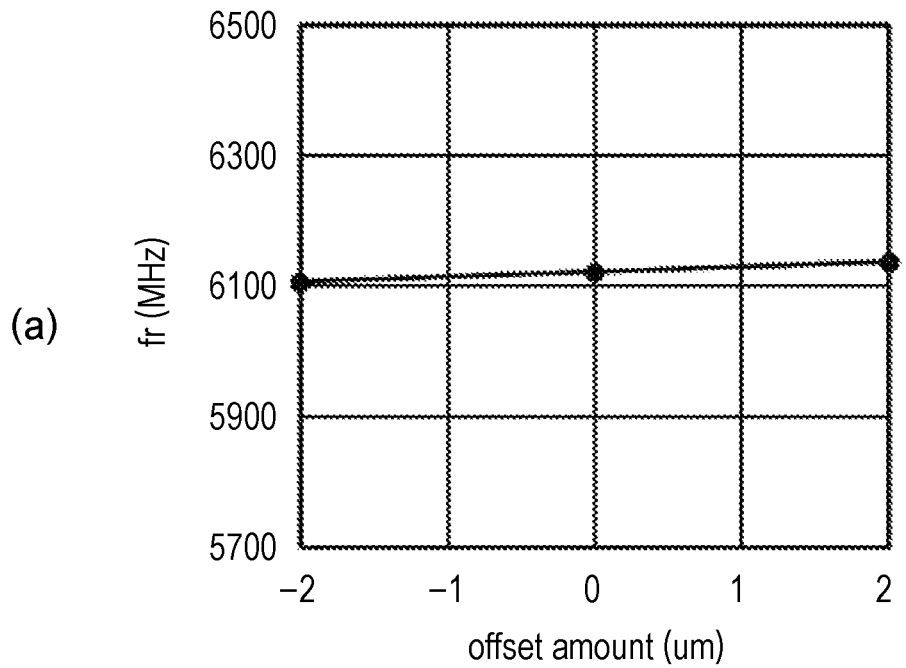
FIG. 6(a) is a graph illustrating a correlation between an offset amount and a resonant frequency.
FIG. 6(b) is a graph illustrating a correlation between an offset amount and df and a correlation between the offset amount and a maximum phase.
Figure 6:
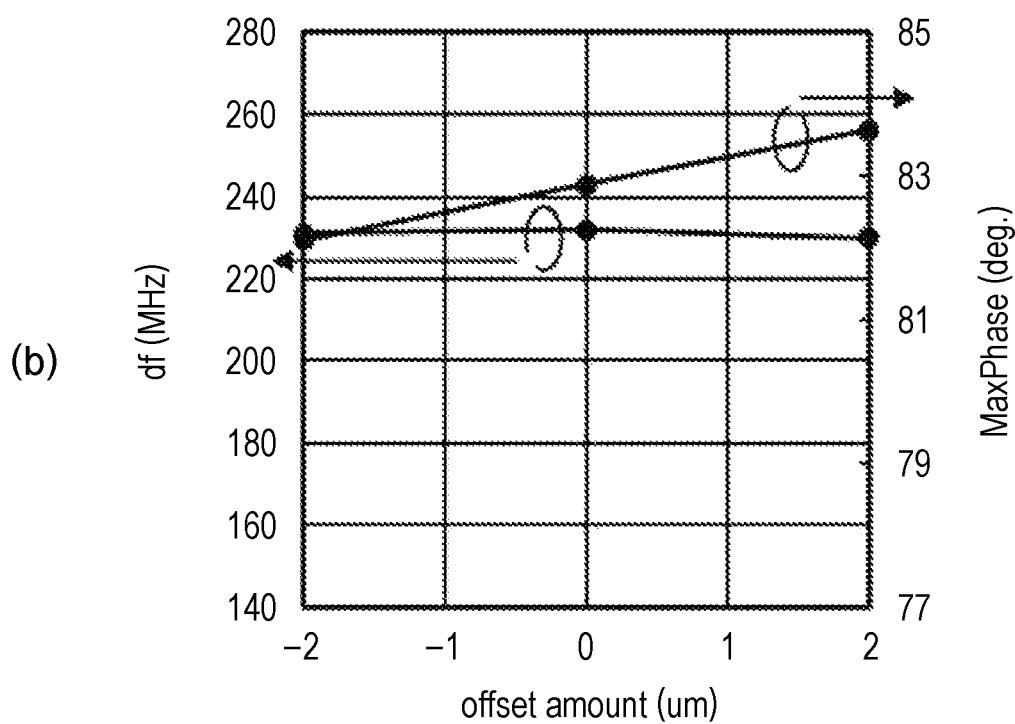

FIG. 6(a) illustrates the relationship between the offset amount and the resonant frequency fr, and FIG. 6(b) illustrates the relationship between the offset amount and df (fr-fa interval) and the relationship between the offset amount and the maximum phase value. As is apparent from FIG. 6, it was confirmed that the maximum phase could be increased with df being maintained as the offset amount increased.

Figure 7:
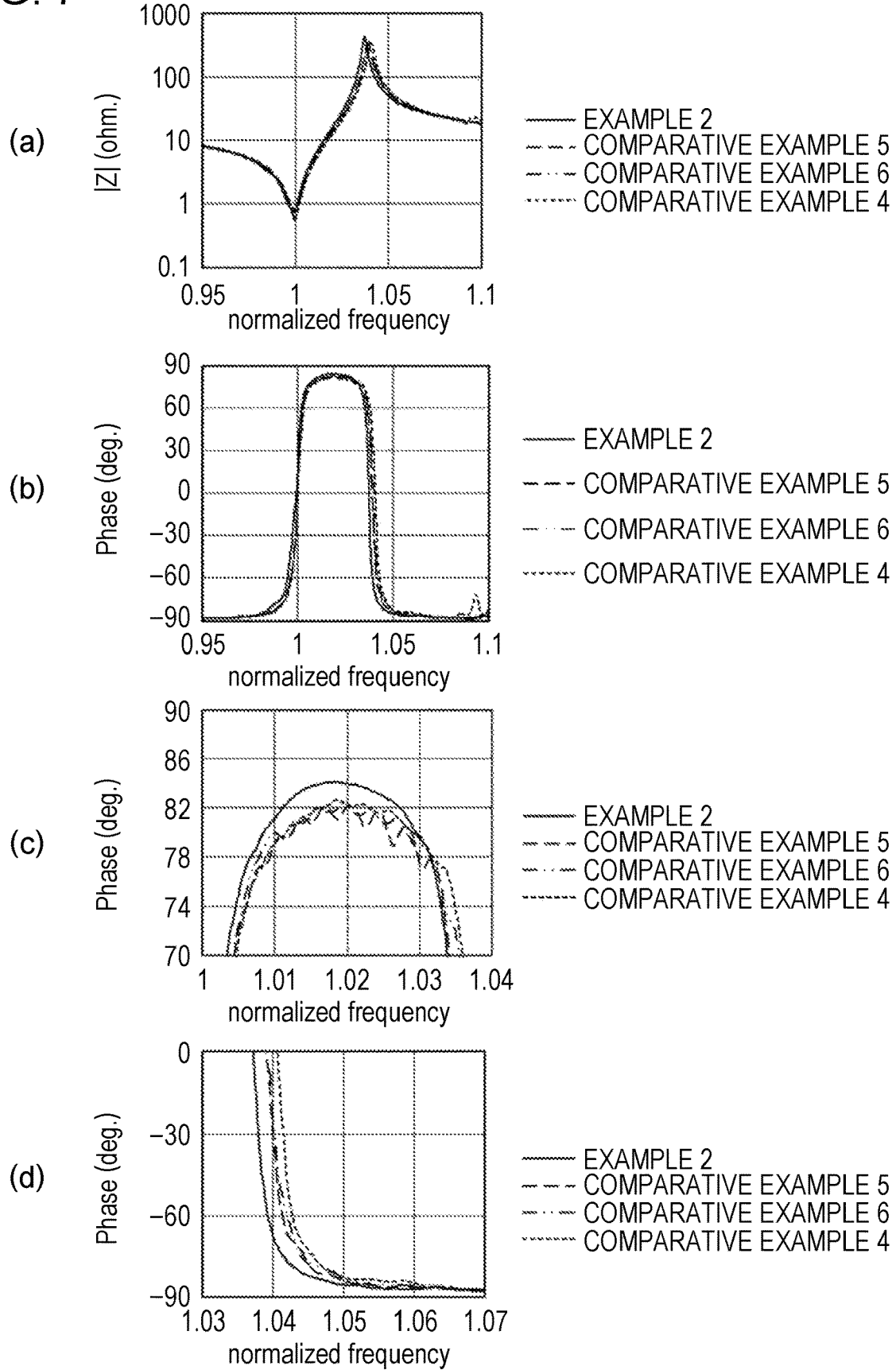
FIG. 7(a) is a graph illustrating impedance characteristics of Example and Comparative Examples.
FIG. 7(b) is a graph illustrating phase characteristics of Example and Comparative Examples.
FIG. 7(c) and FIG. 7(d) are enlarged views of a main part of FIG. 7(b).
Figure 8:
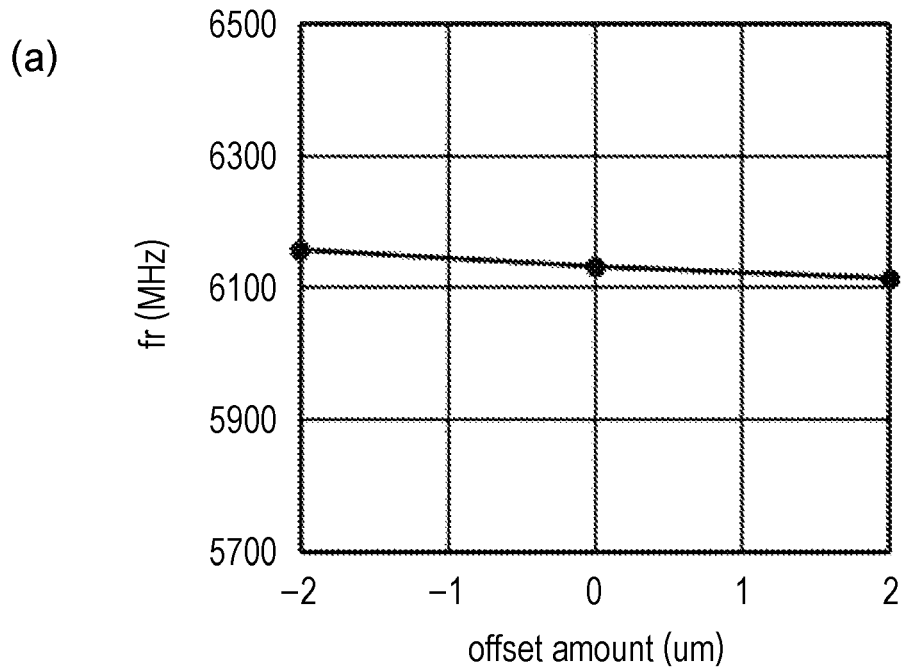
FIG. 8(a) is a graph illustrating a correlation between an offset amount and a resonant frequency.
FIG. 8(b) is a graph illustrating a correlation between an offset amount and df and a correlation between the offset amount and a maximum phase.
Figure 8:
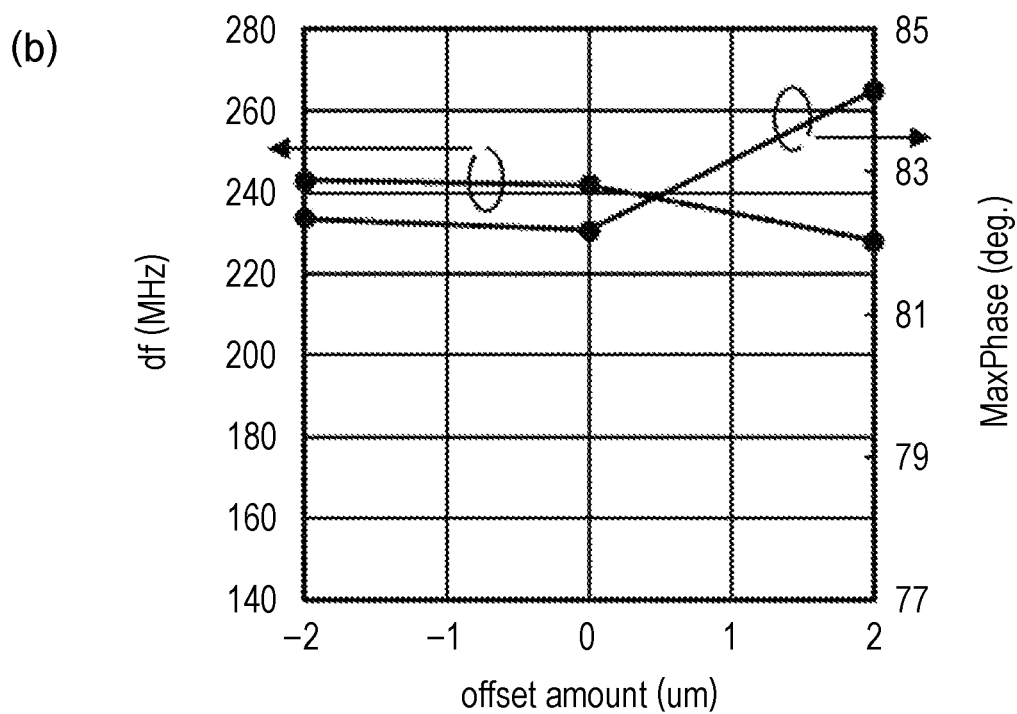

FIG. 7 and FIG. 8 illustrate results in a case where the propagation angle of the piezoelectric layer 7 is expressed by $\psi=0°$ as Example 2 and Comparative Examples 4 to 6. FIG. 7 includes graphs corresponding to those in FIG. 5, and FIG. 8 includes graphs corresponding to those in FIG. 6.

As is apparent from these figures, the elastic wave element according to Example 2 has an improved phase characteristic in fr-fa and the vicinity thereof regardless of the propagation angle. Specifically, the overall phase level is improved, and phase spurious between fr and fa is reduced. Furthermore, it was confirmed that the phase could be reduced also on the high frequency side of fa.

As is apparent from FIG. 8, a state was confirmed in which the maximum phase increased as the offset amount increased also in a case where the propagation angle was 0°.

From the above results, in a case where a higher resonant frequency is required, the propagation angle may be set to 90°, and in a case where a resonator having a small df is required to form a steep filter, the propagation angle may be set to 0°.

In the above-described example, both the first electrode fingers 27A and the second electrode fingers 27B have the wide portion 27W at the bases thereof. Alternatively, only the first electrode fingers 27A or the second electrode fingers 27B may have the wide portion 27W.

As a comparative example, an elastic wave element was fabricated in which the thickness of the piezoelectric layer 7 is similar to that in the above-described embodiment but the cut angles are different so as to achieve resonance at a frequency lower than that in the above-described example. That is, an elastic wave element that uses an elastic wave of a type different from the Lamb wave according to the present application was fabricated, and the characteristics thereof were measured by changing the offset amount. As a result, it was confirmed that the wide portion 27W extending to the region R3 as described above was not required to be provided. From the above, it was confirmed that the improvement in characteristics resulting from including the wide portion 27W extending to the region R3 as described above was an effect produced only in the case of using an A1-mode Lamb wave.

Although the wide portion 27W is provided in the above-described example, a similar effect can be obtained by providing, at the same position, a thick film portion having a larger thickness than the other portions.

(Offset Amount)

Figure 11:
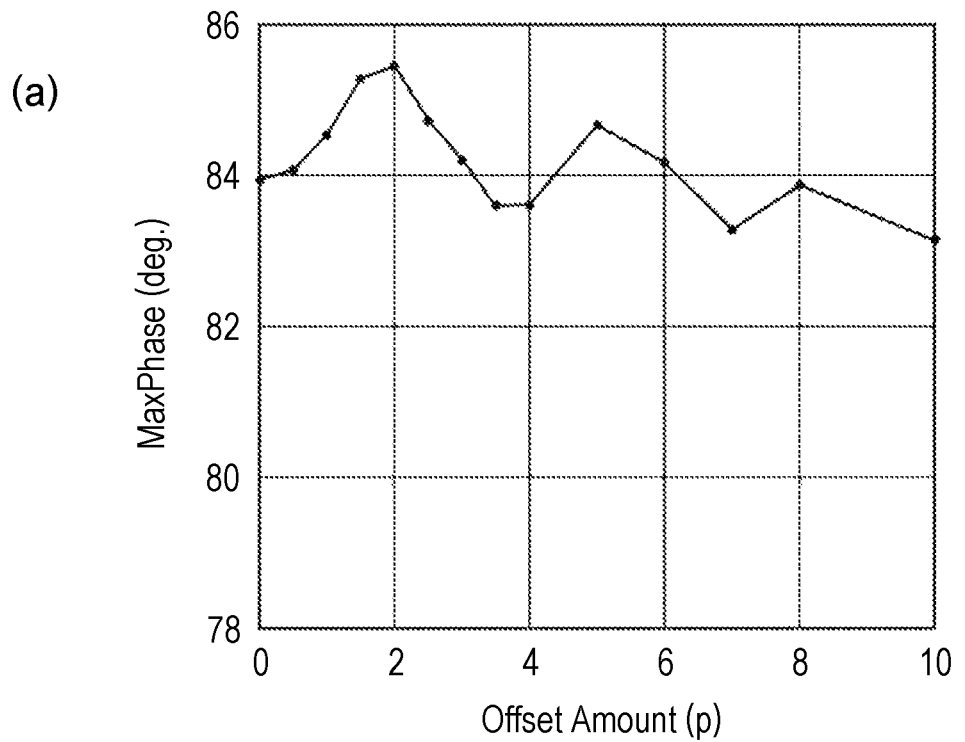
FIG. 11(a) and FIG. 11(b) are graphs each illustrating a correlation between an offset amount and a maximum phase value.
Figure 11:
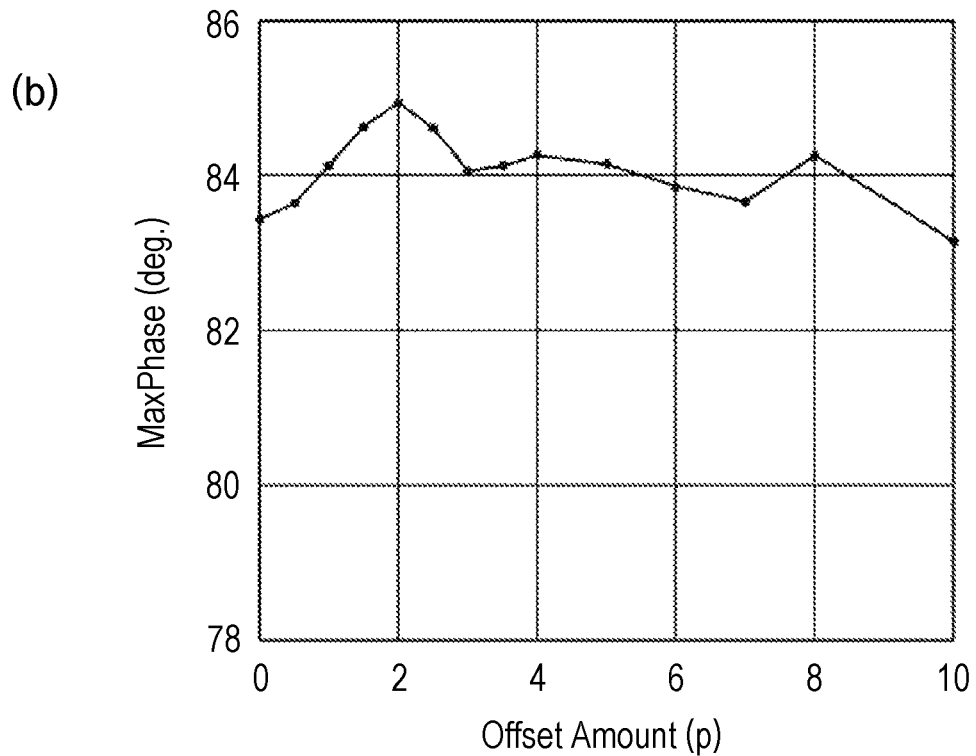

Next, the range of the offset amount was confirmed. Specifically, frequency characteristics were measured when the offset amount with respect to the pitch p was changed from 0 to 10 in the pitch p ratio. The results are illustrated in FIG. 11. FIG. 11 includes graphs each illustrating the state of change in the maximum phase value with respect to the offset amount. FIG. 11(a) illustrates a result in a case where a 106° Y-rotated X-propagation LT substrate was used as the piezoelectric layer 7. FIG. 11(b) illustrates a result in a case where a Z-rotated Y-propagation LN substrate was used as the piezoelectric layer 7.

In FIG. 11, the horizontal axis represents offset amount and the vertical axis represents maximum phase (unit: deg.). As is apparent from FIG. 11, it was confirmed that the maximum phase value periodically increased and decreased as the offset amount increased, and that the maximum phase value took a maximum value when the offset amount was 2p regardless of the material of the piezoelectric layer 7. From the above, it was confirmed that the maximum phase could be increased when the offset amount was 1p to 3p. More preferably, the offset amount may be 1.5p or more and 2.5p or less.

A gap distance (the length of the region R2 in the D2 direction) is 0.3p. That is, it can be confirmed that it is important for the wide portion 27W to extend from the region R1 beyond the region R2 to the region R3.

(Widening Amount)

Frequency characteristics were measured when the line width of the wide portion 27W was changed with respect to the line width of the electrode finger 27 in the region R4. Specifically, frequency characteristics were measured while the duty in the region R4 was changed from 0.35 to 0.5 and, at each duty, the duty in the wide portion 27W was changed from the value of the duty in the region R4 to 0.75. The offset amount was set to 2p.

Figure 12:
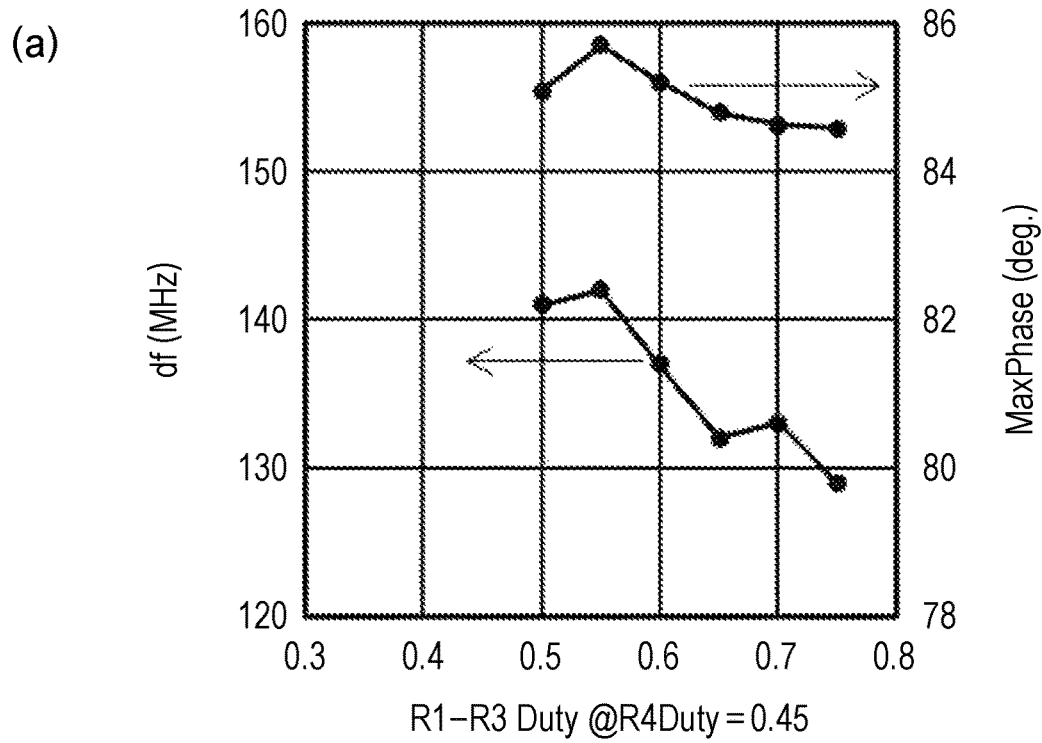
FIG. 12(a) is a graph illustrating a relationship between a duty in a wide portion and frequency characteristics.
FIG. 12(b) is a graph illustrating a relationship between a duty in the wide portion and a duty in an intersection portion.
Figure 12:
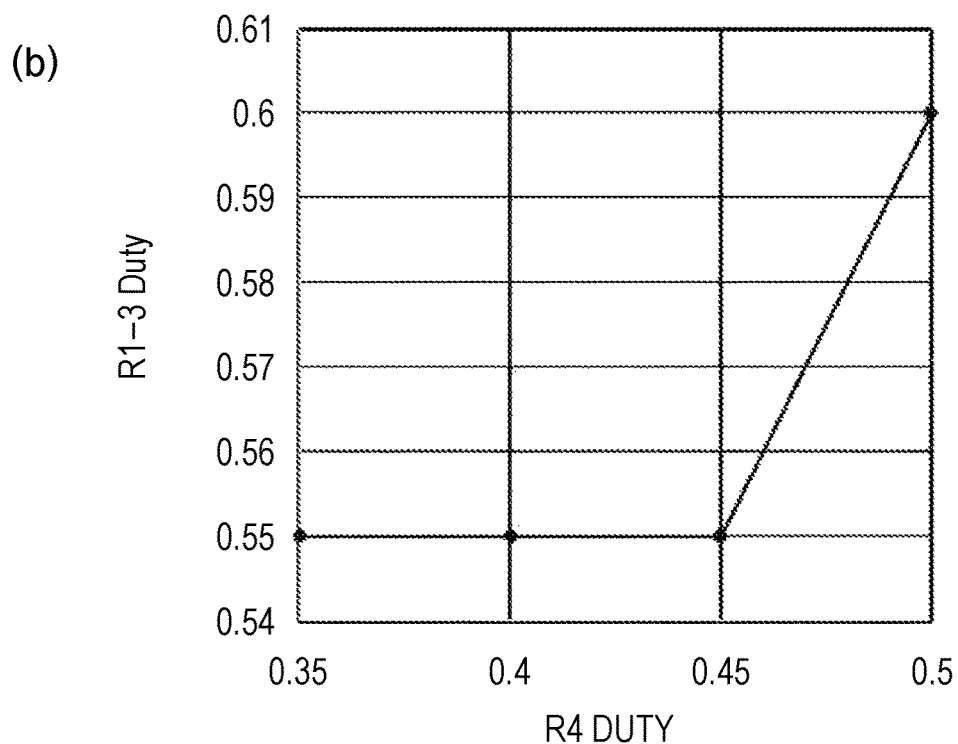

FIG. 12 illustrates the results in a case where an LT substrate was used as the piezoelectric layer 7. FIG. 12(a) is a graph illustrating the relationship between the duty of the wide portion 27W and the difference (df) between the resonant frequency and the anti-resonant frequency, and the relationship between the duty of the wide portion 27W and the maximum phase value when the duty in the region R4 was 0.45. As is apparent from FIG. 12(a), it was confirmed that, while there was a threshold at which df rapidly decreased as the duty of the wide portion 27W increased, the maximum phase had a relatively stable value although there was a value taking a maximum value.

From the above, the value of the duty of the wide portion 27W at which the maximum phase value takes a maximum value was obtained in the range where the duty of the wide portion 27W is smaller than the threshold at which df decreases, and is illustrated in FIG. 12(b). FIG. 12(b) is a graph illustrating the relationship between the duty in the region R4 and preferable values of the duty of the wide portion. As is apparent from FIG. 12(b), when the duty in the region R4 is 0.45 or less, the duty of the wide portion 27W may be 0.55, and when the duty in the region R4 is 0.5, the duty of the wide portion 27W may be 0.6. When the duty in the region R4 is 0.5 or more, the duty of the wide portion 27W may be a value obtained by adding 0.1 to the duty in the region R4 in order to increase the maximum phase value and secure df.

Because the change in the maximum phase value is relatively small, when the duty in the region R4 is 0.45 or less, the duty of the wide portion 27W may be 0.50 to 0.60, and when the duty in the region R4 is 0.5 or more, the duty of the wide portion 27W may be a value obtained by adding 0.5 to 1.5 to the duty in the region R4.

Figure 13:
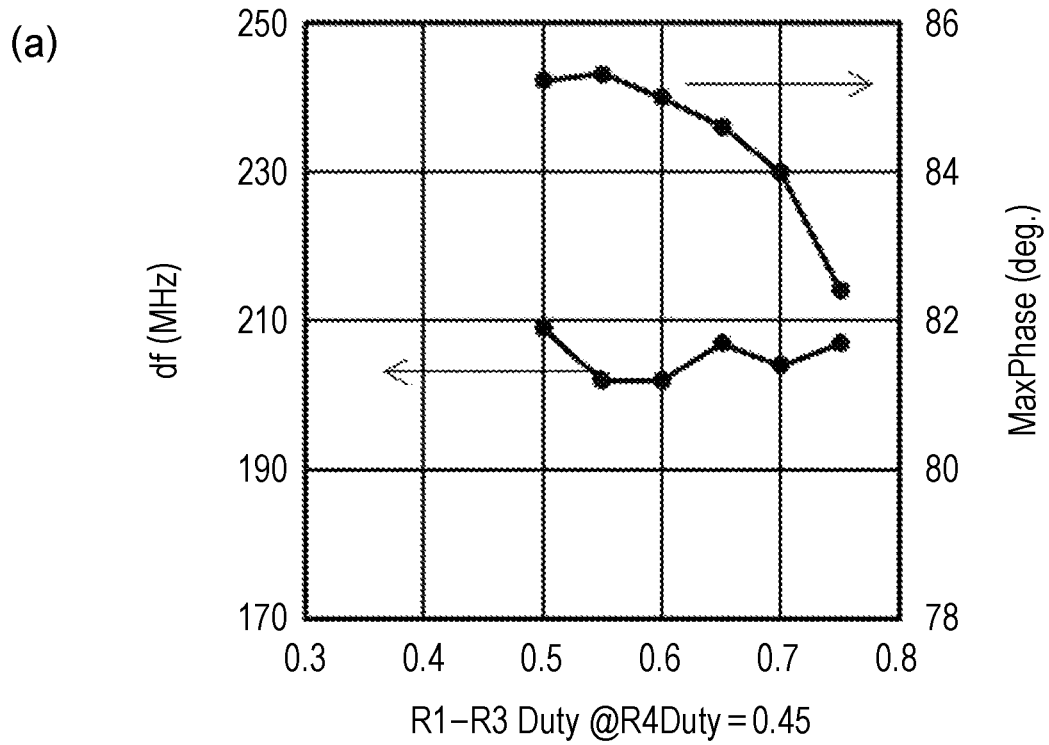
FIG. 13(a) is a graph illustrating a relationship between a duty in a wide portion and frequency characteristics.
FIG. 13(b) is a graph illustrating a relationship between a duty in the wide portion and a duty in an intersection portion.
Figure 13:
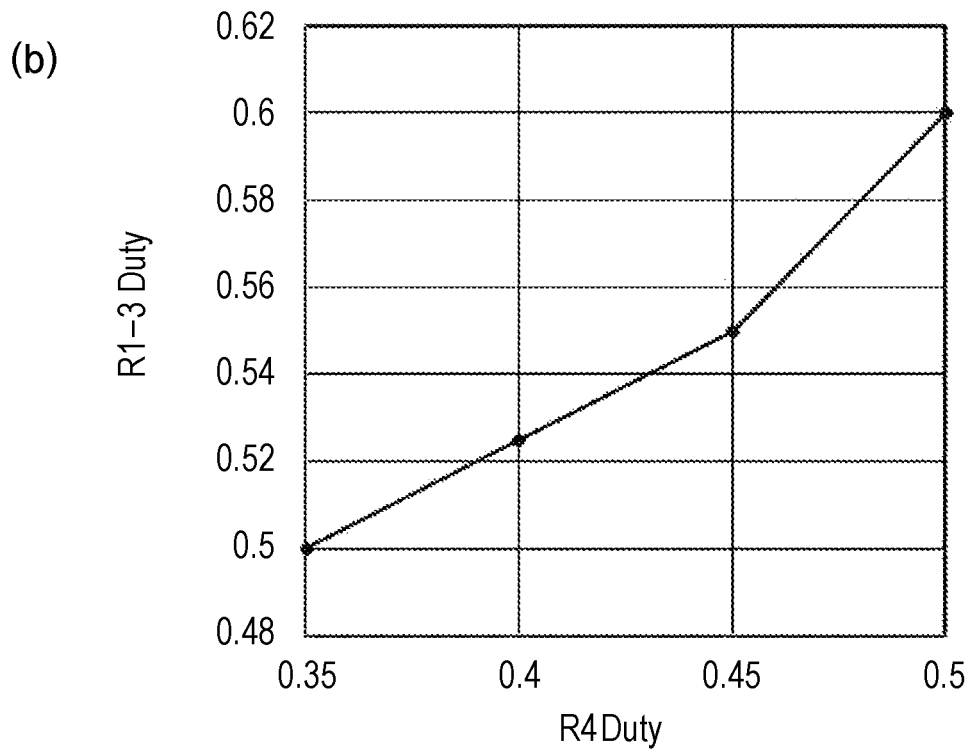

Next, FIG. 13 includes graphs corresponding to those in FIG. 12 in a case where an LN substrate was used as the piezoelectric layer 7. In a case where the piezoelectric layer 7 was an LN substrate, there was no threshold at which df largely changed, and thus a preferable value was obtained as the maximum phase value. As a result, when the duty in the region R4 is 0.45 or less, the duty of the wide portion 27W may be 0.50 to 0.60, and when the duty in the region R4 is 0.5 or more, the duty of the wide portion 27W may be a value obtained by adding 0.1 to the duty in the region R4.

The maximum phase value changes in a quadratic function manner with the maximum value being interposed. Thus, the characteristics can be maintained in a range of about 0.1 with the maximum value being interposed. Thus, when the duty in the region R4 is 0.45 or less, the duty of the wide portion 27W may be 0.50 to 0.60, and when the duty in the region R4 is 0.5 or more, the duty of the wide portion 27W may be a value obtained by adding 0.5 to 1.5 to the duty in the region R4.

(Modification)

In the examples described above, the configuration including the multilayer film 5 has been described as an example, but the multilayer film 5 need not necessarily be included. An elastic wave device 1A illustrated in FIG. 14 has a membrane shape in which the piezoelectric layer 7 is disposed on the substrate 3 having a recessed portion 3x. Also in this case, similar effects can be obtained as long as a Lamb wave is used.

Figure 15:
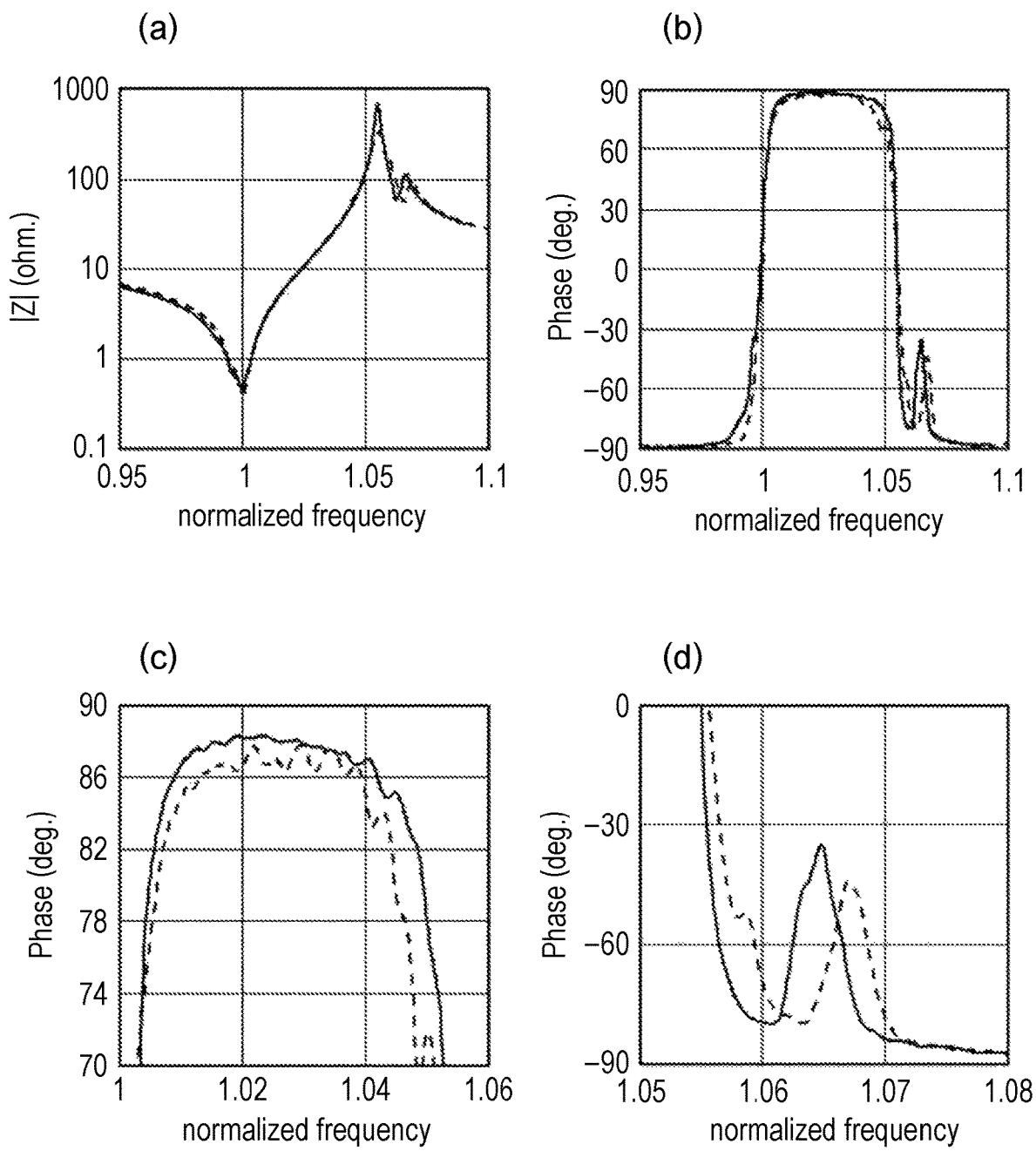
FIG. 15(a) is a graph illustrating impedance characteristics of Example and Comparative Example.
FIG. 15(b) is a graph illustrating phase characteristics of Example and Comparative Example.
FIG. 15(c) and FIG. 15(d) are enlarged views of a main part of FIG. 15(b).

In FIG. 15, the frequency characteristics of the elastic wave device 1A are represented by solid lines as Example 3. In FIG. 15, broken lines represent the frequency characteristics of an elastic wave device according to Comparative Example 7, having a configuration similar to that of the elastic wave device 1A except that the wide portion 27A is not provided. FIG. 15(a) to FIG. 15(d) are graphs corresponding to FIG. 5(a) to FIG. 5(d).

As is apparent from FIG. 15, it was confirmed that the maximum phase value could be increased also in the membrane-shaped elastic wave device 1A that does not include a multilayer film.

(Modification)

Figure 14:
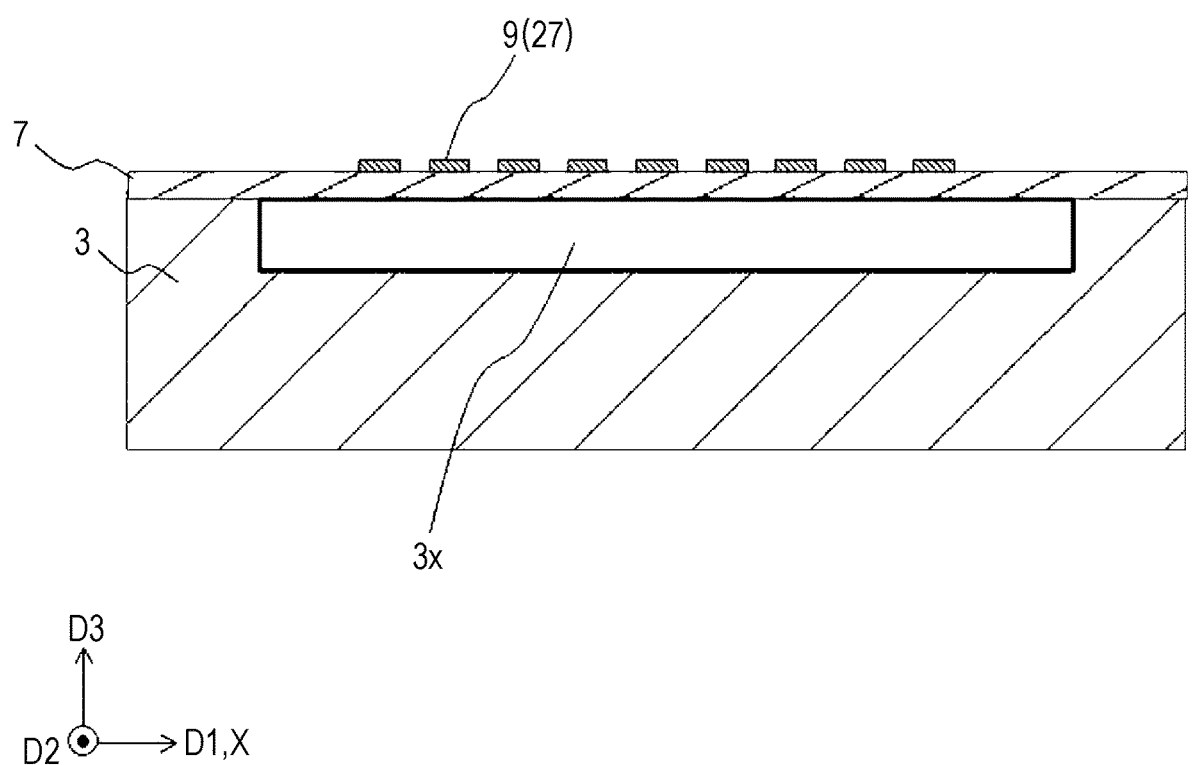
FIG. 14 is a sectional view of a main part illustrating a modification of the elastic wave device in FIG. 1.
Figure 16:
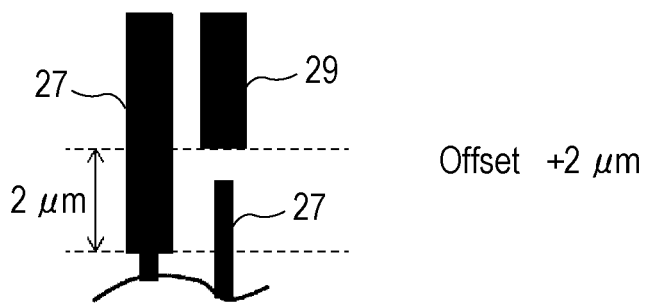
FIG. 16 is a diagram illustrating electrode finger models of Examples and Comparative Example.
Figure 16:
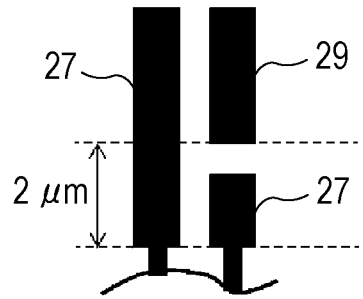
Figure 16:
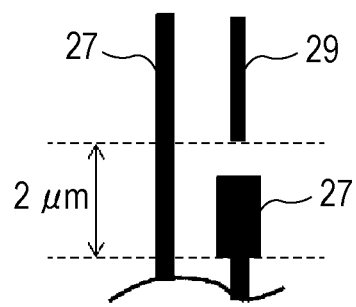

In a membrane-shaped elastic wave device such as the elastic wave device 1A illustrated in FIG. 14, the shapes of the electrode fingers 27 were set to those in Examples 4 and 5 and Comparative Example 8 illustrated in FIG. 16. Specifically, the shapes in Example 4 are similar to those in Example 1. In Example 5, the tip portion of the electrode finger 27 located in the region R3 has a wide portion in the electrode finger shape of Example 4. In Comparative Example 8, only the tip portion of the electrode finger 27 located in the region R3 has a wide portion, and the other portions have an electrode finger width equivalent to that in the region R4.

Figure 17:
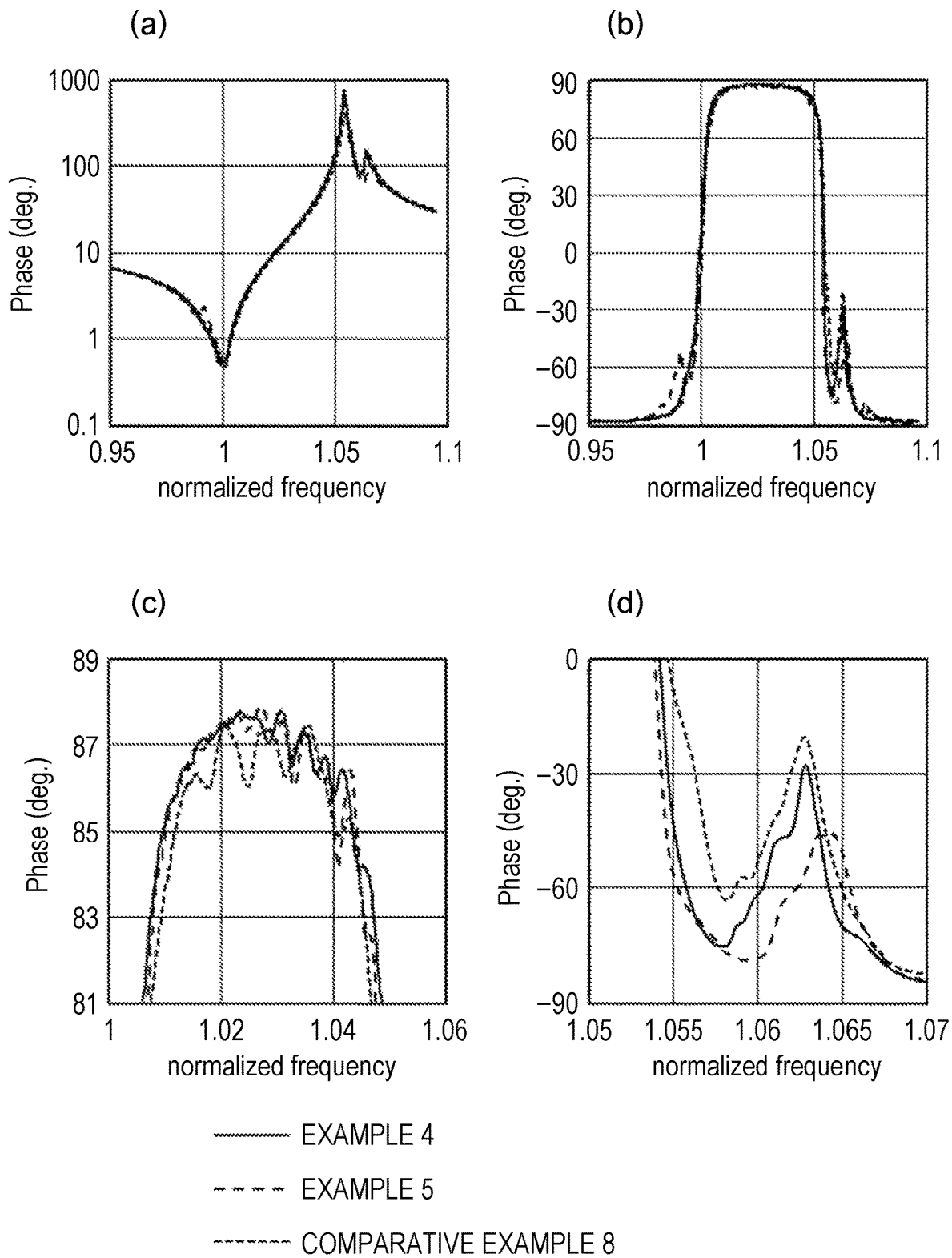
FIG. 17(a) is a graph illustrating impedance characteristics of Examples and Comparative Example.
FIG. 17(b) is a graph illustrating phase characteristics of Examples and Comparative Example.
FIG. 17(c) and FIG. 17(d) are enlarged views of a main part of FIG. 17 (b).

FIG. 17 illustrates measurement results of the frequency characteristics in Examples 4 and 5 and Comparative Example 8. FIG. 17(a) to FIG. 17(d) are graphs corresponding to FIG. 5(a) to FIG. 5(d). In the figure, Example 4 is indicated by a solid line, Example 5 is indicated by a long-interval broken line, and Comparative Example 8 is indicated by a short-interval broken line.

As is apparent from FIG. 17(c), it can be confirmed that, in Comparative Example 8, spurious frequently occurs between fr and fa and leakage in the transverse mode is not reduced. In other words, it was confirmed that simply increasing the electrode width in the region R3 is not effective and that loss in the transverse mode can be reduced by the wide portion 27W extending from the base of the electrode finger 27.

It was confirmed from comparison between Example 4 and Example 5 that, in Example 5, as compared to Example 4, the characteristics were slightly improved on the higher frequency side than fa, but spurious slightly increased between fr and fa, and spurious occurred on the lower frequency side than fr.

(Other Modifications)

The width of the wide portion 27W may be uniform in the regions R1 to R3. In this case, there is no protrusion protruding in the elastic wave propagation direction, and thus the possibility of short-circuiting between the electrode fingers can be reduced.

(Application Example of Elastic Wave Device: Splitter)

Figure 9:
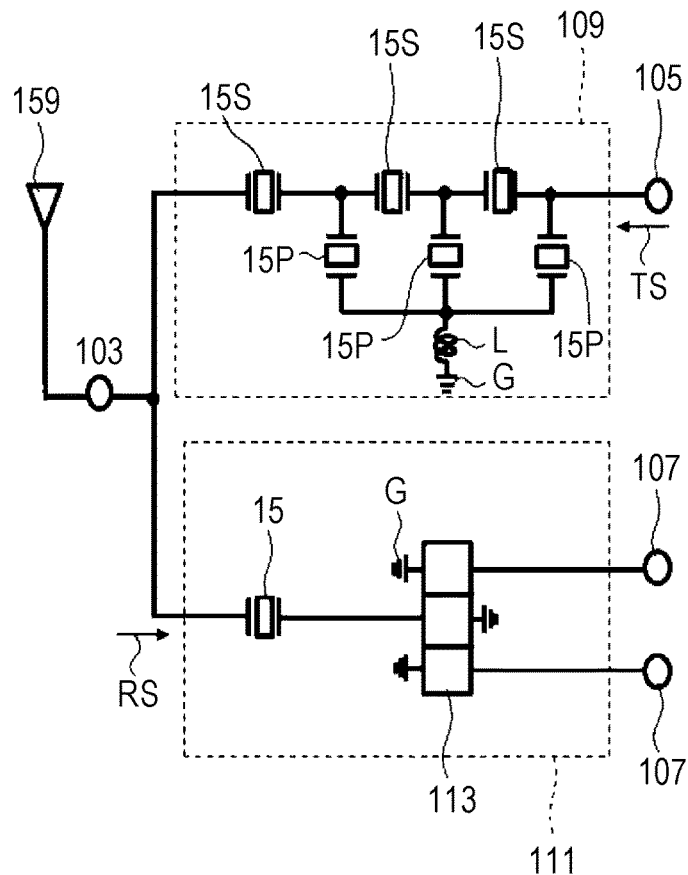
FIG. 9 is a circuit diagram schematically illustrating a configuration of a splitter as an application example of the elastic wave device in FIG. 1.

FIG. 9 is a circuit diagram schematically illustrating a configuration of a splitter 101 as an application example of the elastic wave device 1. As is understood from the reference signs illustrated on the upper left side of this figure on paper, the comb-teeth electrodes 23 and the reflectors 21 are illustrated in a simplified manner in this figure.

The splitter 101 includes, for example, a transmission filter 109 that filters a transmission signal from a transmission terminal 105 and outputs the filtered transmission signal to an antenna terminal 103, and a reception filter 111 that filters a reception signal from the antenna terminal 103 and outputs the filtered reception signal to a pair of reception terminals 107.

The transmission filter 109 is formed of, for example, a ladder filter in which a plurality of resonators 15 are connected to each other in a ladder shape. That is, the transmission filter 109 includes one or more resonators 15 connected in series between the transmission terminal 105 and the antenna terminal 103, and one or more resonators 15 (parallel arm) connecting the series line (series arm) of the resonators 15 to a reference potential. The plurality of resonators 15 constituting the transmission filter 109 are provided, for example, on or in the same affixed substrate 2 (3, 5, and 7).

The reception filter 111 includes, for example, the resonator 15 and a multi-mode filter (including a double-mode filter) 113. The multi-mode filter 113 includes a plurality of (three in the illustrated example) IDT electrodes 19 arranged in the elastic wave propagation direction and a pair of reflectors 21 disposed on both sides thereof. The resonator 15 and the multi-mode filter 113 that constitute the reception filter 111 are provided, for example, on or in the same affixed substrate 2.

The transmission filter 109 and the reception filter 111 may be provided on or in the same affixed substrate 2, or may be provided on or in different affixed substrates 2. FIG. 9 illustrates merely an example of the configuration of the splitter 101. For example, the reception filter 111 may be formed of a ladder filter similarly to the transmission filter 109.

Although a description has been given of the case where the splitter 101 includes the transmission filter 109 and the reception filter 111, the splitter 101 is not limited thereto. For example, the splitter 101 may be a diplexer or a multiplexer including three or more filters.

(Application Example of Elastic Wave Device: Communication Apparatus)

Figure 10:
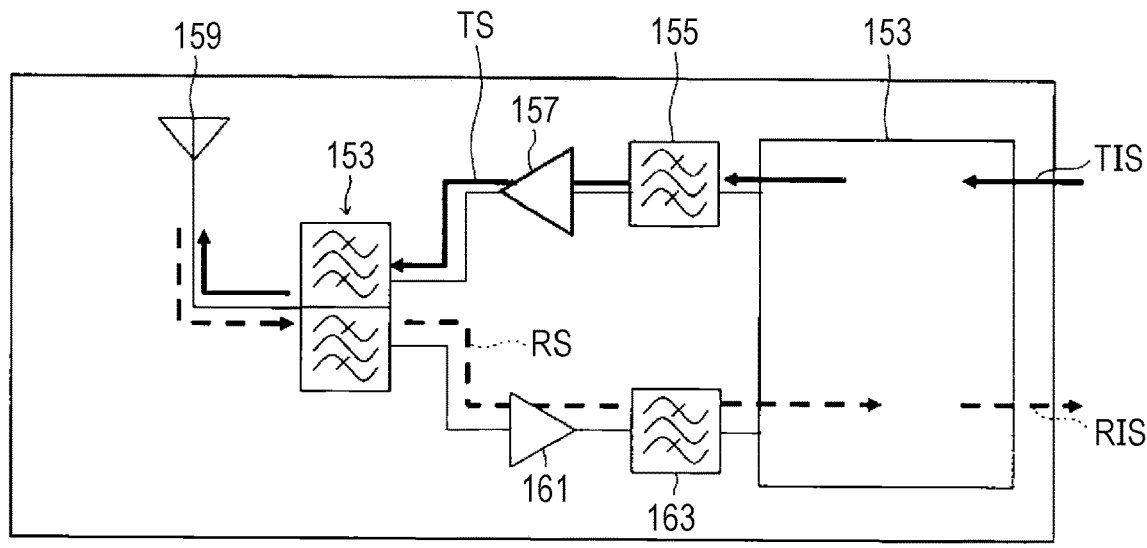
FIG. 10 is a circuit diagram schematically illustrating a configuration of a communication apparatus as an application example of the elastic wave device in FIG. 1.

FIG. 10 is a block diagram illustrating a main part of a communication apparatus 151 as an application example of the elastic wave device 1 (splitter 101). The communication apparatus 151 performs wireless communication using a radio wave, and includes the splitter 101.

In the communication apparatus 151, a transmission information signal TIS including information to be transmitted is subjected to modulation and frequency up-conversion (conversion of a carrier frequency to a radio frequency signal) performed by a radio frequency integrated circuit (RF-IC) 153, thereby being converted to a transmission signal TS. The transmission signal TS is subjected to removal of unnecessary components outside a transmission pass band, performed by a band-pass filter 155, is amplified by an amplifier 157, and is input to the splitter 101 (the transmission terminal 105). Subsequently, the splitter 101 (the transmission filter 109) removes unnecessary components outside the transmission pass band from the transmission signal TS input thereto, and outputs the transmission signal TS after the removal from the antenna terminal 103 to an antenna 159. The antenna 159 converts the electric signal (transmission signal TS) input thereto into a radio signal (radio wave) and transmits the radio signal.

In the communication apparatus 151, a radio signal (radio wave) received by the antenna 159 is converted into an electric signal (reception signal RS) by the antenna 159 and is input to the splitter 101 (the antenna terminal 103). The splitter 101 (the reception filter 111) removes unnecessary components outside a reception pass band from the reception signal RS input thereto and outputs a resultant signal from the reception terminals 107 to an amplifier 161. The output reception signal RS is amplified by the amplifier 161, and is subjected to removal of unnecessary components outside the reception pass band, performed by a band-pass filter 163. Subsequently, the reception signal RS is subjected to frequency down-conversion and demodulation performed by the RF-IC 153, thereby being converted into a reception information signal RIS.

The transmission information signal TIS and the reception information signal RIS may be low-frequency signals (baseband signals) including appropriate information and are, for example, analog audio signals or digitized audio signals. The pass band of a radio signal may be appropriately set and may be, in the present embodiment, a pass band of a relatively high frequency (for example, 5 GHz or more). The modulation scheme may be any one of phase modulation, amplitude modulation, and frequency modulation, or may be a combination of any two or more of them. A direct conversion scheme is illustrated as a circuit scheme in FIG. 17. However, any other appropriate scheme, for example, a double superheterodyne scheme, may be used. FIG. 10 schematically illustrates only a main part. A low-pass filter, an isolator, or the like may be added at an appropriate position. In addition, the position of the amplifier or the like may be changed.

The present disclosure is not limited to the above embodiment and may be implemented in various forms. For example, the thickness of each layer and the Euler angles of the piezoelectric layer may have values outside the ranges exemplified in the embodiment.

REFERENCE SIGNS LIST

1 • • • elastic wave device, 3 • • • substrate, 5 • • • multilayer film, 7 • • • piezoelectric layer, 19 • • • IDT electrode, 11 • • • low acoustic impedance layer, 13 • • • high acoustic impedance layer, 37 • • • protective film

The invention claimed is:

1. An elastic wave device comprising:
a piezoelectric layer;
a plurality of resonators each including an IDT electrode located on the piezoelectric layer; and
a protective film located on the plurality of resonators,
wherein the IDT electrode includes
   a first busbar and a second busbar that are connected to potentials different from each other and that are disposed with a distance therebetween, and
   first electrode fingers and second electrode fingers that are alternately arranged in an elastic wave propagation direction, the first electrode fingers being connected to the first busbar and extending toward the second busbar, the second electrode fingers being connected to the second busbar and extending toward the first busbar,
   each first electrode finger having a wide portion extending from a portion connected to the first busbar to a position overlapping tip ends of the second electrode fingers when viewed in an arrangement direction of the first electrode fingers and the second electrode fingers, the wide portion having a width greater than a width, of the first electrode finger, at a vicinity of a center of an intersection region of the first electrode fingers and the second electrode fingers, and
wherein the piezoelectric layer has a thickness of less than 1.5p, where p denotes a pitch of the electrode fingers of the IDT electrode.

2. The elastic wave device according to claim 1, wherein the elastic wave device uses an A1-mode Lamb wave.

3. The elastic wave device according to claim 1, wherein the piezoelectric layer has a thickness of 0.6p or less, where p denotes a pitch of the electrode fingers of the IDT electrode.

4. The elastic wave device according to claim 1, wherein the piezoelectric layer is made of a lithium niobate single crystal and has Euler angles ($\varphi$, $\theta$, $\psi$) of ($0\pm10°$, $0°\pm10°$, $0°$ to $360°$).

5. The elastic wave device according to claim 1,
wherein the IDT electrode includes first dummy electrodes connected to the first busbar, each first dummy electrode facing a tip end of a corresponding one of the second electrode fingers, and
second dummy electrodes connected to the second busbar, each second dummy electrode facing a tip end of a corresponding one of the first electrode fingers,
the first dummy electrodes and the second dummy electrodes each having a width greater than the width at the vicinity of the center of the intersection region of the first electrode fingers and the second electrode fingers.

6. The elastic wave device according to claim 5,
wherein assuming that a direction in which the first electrode fingers extend is a first direction, a repetitive arrangement direction of the first electrode fingers and the second electrode fingers is a second direction, and a pitch of the electrode fingers of the IDT electrode is p,
the wide portion extends from a position at an edge of the second dummy electrodes when viewed in the second direction to a position 1.5p or more and 2.5p or less away in a direction opposite from the first busbar in the first direction.

7. The elastic wave device according to claim 1, comprising:
a substrate; and
a multilayer film located on the substrate and including a low acoustic impedance layer and a high acoustic impedance layer that are alternately stacked,
wherein the piezoelectric layer is located on the multilayer film.

8. A splitter comprising:
an antenna terminal;
a transmission filter configured to filter a signal that is to be output to the antenna terminal; and
a reception filter configured to filter a signal received from the antenna terminal,
wherein at least one of the transmission filter or the reception filter includes the elastic wave device according to claim 1.

9. A communication apparatus comprising:
an antenna;
the splitter according to claim 8, comprising the antenna terminal connected to the antenna; and
an IC connected to the transmission filter and the reception filter, the IC being connected on an opposite side from the antenna terminal in a signal path.

10. An elastic wave device comprising:
a piezoelectric layer;
a plurality of resonators each including an IDT electrode located on the piezoelectric layer; and
a protective film located on the plurality of resonators,
wherein the IDT electrode includes
   a first busbar and a second busbar that are connected to potentials different from each other and that are disposed with a distance therebetween, and
   first electrode fingers and second electrode fingers that are alternately arranged in an elastic wave propagation direction, the first electrode fingers being connected to the first busbar and extending toward the second busbar, the second electrode fingers being connected to the second busbar and extending toward the first busbar,
   each first electrode finger having a wide portion extending from a portion connected to the first busbar to a position overlapping tip ends of the second electrode fingers when viewed in an arrangement direction of the first electrode fingers and the second electrode fingers, the wide portion having a width greater than a width, of the first electrode finger, at a vicinity of a center of an intersection region of the first electrode fingers and the second electrode fingers, and
wherein the elastic wave device uses an A1-mode Lamb wave.

* * * * *